United States Patent
Ichiki et al.

(10) Patent No.: US 10,301,170 B2
(45) Date of Patent: May 28, 2019

(54) VALVE, FLUID DEVICE, METHOD FOR CONTROLLING FLUID, AND METHOD FOR MANUFACTURING VALVE

(71) Applicants: The University of Tokyo, Tokyo (JP); NIKON CORPORATION, Tokyo (JP)

(72) Inventors: Takanori Ichiki, Tokyo (JP); Shoutarou Terane, Tokyo (JP); Kuno Suzuki, Iruma-gun (JP)

(73) Assignees: THE UNIVERSITY OF TOKYO, Tokyo (JP); NIKON CORPORATION, Tokyo (JP)

( * ) Notice: Subject to any disclaimer, the term of this patent is extended or adjusted under 35 U.S.C. 154(b) by 0 days.

(21) Appl. No.: 15/392,916

(22) Filed: Dec. 28, 2016

(65) Prior Publication Data
US 2017/0175931 A1    Jun. 22, 2017

Related U.S. Application Data

(63) Continuation of application No. PCT/JP2015/069572, filed on Jul. 7, 2015.

(30) Foreign Application Priority Data

Jul. 7, 2014  (JP) .................... 2014-140066

(51) Int. Cl.
- *F16K 7/17* (2006.01)
- *B81B 3/00* (2006.01)
- *B81C 1/00* (2006.01)

(52) U.S. Cl.
CPC ................ *B81B 3/00* (2013.01); *B81C 1/00* (2013.01); *F16K 7/17* (2013.01)

(58) Field of Classification Search
CPC . F16K 7/12; F16K 7/123; F16K 7/126; F16K 7/14; F16K 7/17; F16K 99/0015; B81B 3/00; B81C 1/00
USPC ......................................................... 251/61.1
See application file for complete search history.

(56) References Cited

U.S. PATENT DOCUMENTS

| | | | | |
|---|---|---|---|---|
| 2,732,167 A | * | 1/1956 | Stout et al. ............. | E03D 1/304 251/61.1 |
| 2,980,385 A | * | 4/1961 | Hunter ...................... | F16K 7/17 251/25 |
| 3,515,166 A | * | 6/1970 | Paccard ................ | E21D 15/512 251/61.1 |

(Continued)

FOREIGN PATENT DOCUMENTS

GB    2252147 A    7/1992

OTHER PUBLICATIONS

International Search Report for International Application No. PCT/JP/2015/069572 dated Oct. 13, 2015, with translation; 8 pages.

(Continued)

*Primary Examiner* — Eric Keasel
(74) *Attorney, Agent, or Firm* — Squire Patton Boggs (US) LLP

(57) ABSTRACT

A valve is provided with a tubular structure having an outer tube and an inner tube, and a diaphragm member having a thin film disposed to cover one end of the inner tube and an anchor part which encircles a peripheral edge of the thin film and comes into close contact with an inner wall of the outer tube and an outer wall of the inner tube.

20 Claims, 18 Drawing Sheets

(56) References Cited

U.S. PATENT DOCUMENTS

| | | | | | |
|---|---|---|---|---|---|
| 3,556,465 | A | * | 1/1971 | Little | F16K 7/17 |
| | | | | | 251/61.1 |
| 3,566,913 | A | * | 3/1971 | Parthe, Jr. | F16K 17/18 |
| | | | | | 137/220 |
| 4,190,045 | A | * | 2/1980 | Bartels | A61M 16/20 |
| | | | | | 251/61.1 |
| 6,073,630 | A | * | 6/2000 | Adahan | A61M 16/20 |
| | | | | | 128/204.23 |
| 8,142,653 | B2 | * | 3/2012 | Beden | A61M 1/1037 |
| | | | | | 210/240 |

OTHER PUBLICATIONS

Written Opinion for International Application No. PCT/JP/2015/069572 dated Oct. 13, 2015, with translation; 18 pages.
Zhang, W. et al., "PMMA /PDMS valves and pumps for disposable microfluidics," Lab Chip, 2009, vol. 9, pp. 3088-3094.
EPO Communication dated Feb. 27, 2018 for EP Application No. 15818513.2, 7 pages.
EPO Communication dated Sep. 4, 2018 for EP Application No. 15818513.2, 6 pages.

* cited by examiner

VALVE, FLUID DEVICE, METHOD FOR CONTROLLING FLUID, AND METHOD FOR MANUFACTURING VALVE

TECHNICAL FIELD

The present invention relates to a valve, a fluid device, a method for controlling a fluid, and a method for manufacturing the valve.

Priority is claimed on Japanese Patent Application No. 2014-140066, filed Jul. 7, 2014, the content of which is incorporated herein by reference.

BACKGROUND ART

In the related art, as a valve configured to control a flow of a fluid in a fluid path formed at a joining surface between a first substrate and a second substrate constituting a stacked substrate, a valve, which includes a three-layer structure body in which a resin sheet is sandwiched by interfaces of the first substrate and the second substrate, is known. (Non-Patent Document 1).

FIG. 1 shows a cross section of a valve having a conventional three-layer structure body. A resin sheet 111 is stacked on an entire upper surface of a first substrate 110, and a second substrate 112 is further stacked thereon. A groove is engraved on a lower surface of the second substrate 112, the resin sheet 111 is joined to the lower surface of the second substrate 112 to cover the groove, and a fluid path 114 is formed. An arrow facing right in the drawing indicates that a fluid path extends in a right direction in the paper and a fluid flows in the right direction in the paper. Also, a through hole 113 is provided in the first substrate 110. Here, when a pressure is applied to the resin sheet 111 from an inside of the through hole by feeding air, the resin sheet 111 swells upward, the fluid path is blocked, and thus a flow of the fluid is disturbed (refer to FIG. 2). Also, when an air pressure is released, a resin sheet is returned to an original flat shape by its own elasticity. The resin sheet 111 serves as a diaphragm member of the valve through such pressure control.

CITATION LIST

Non-Patent Document

[Non-Patent Document 1]
Zhang W. et al., PMMA/PDMS valves and pumps for disposable microfluidics, Lab Chip, 9, 3088 to 3094, 2009

SUMMARY OF INVENTION

Technical Problem

However, for example, when the above-described valve with the three-layer structure body is repeatedly operated, the resin sheet 111 gradually separates from the upper surface of the first substrate 110 centering on the through hole 113, and thus there is a problem that a response of the valve deteriorates. When the valve still continues to be used in this state, there is a problem that a joining strength between the first substrate 110 and the second substrate 112 weakens, and thus both of the substrates separate from each other.

The present invention was made in view of the above-described circumstances, and an object of the present invention is to provide a valve with excellent durability, a fluid device, a method for controlling a fluid, and a method for manufacturing the valve.

Solution to Problem

An embodiment of the present invention provides [1] to [8] as will be described below.

[1] According to a valve in an embodiment of the present invention, a valve includes: a tubular structure having an outer tube and an inner tube; and a diaphragm member having a thin film disposed to cover one end of the inner tube and an anchor part which encircles a peripheral edge of the thin film and comes into close contact with an inner wall of the outer tube and an outer wall of the inner tube.

[2] According to a valve in an embodiment of the present invention, a valve arranged in a fluid path includes: a tubular structure having an outer tube with a cylinder shape of an inner diameter $2(R+\Delta R)$ and an inner tube with a cylinder shape of an inner diameter $2r$ and an outer diameter $2R$, and a diaphragm member having a thin film which is disposed to cover one end of the inner tube and an anchor part which encircles a peripheral edge of the thin film and comes into close contact with an inner wall of the outer tube and an outer wall of the inner tube, wherein $r$ and $\Delta R$ satisfy the following Expression (a):

$$\Delta R < r \qquad (a).$$

[3] According to a valve in an embodiment of the present invention, a valve arranged in a fluid path includes: a first member a first surface coming into contact with a fluid of which includes a hole having an opening; a second member which is provided inside the opening; and a diaphragm member having a thin film which is disposed to cover one end of the second member, an anchor part which is provided in accordance with a shape of the second member, and a connection part which is provided between the thin film and the anchor part and comes into close contact with and is fixed to a surface of the one end of the second member, in which the thin film, the anchor part, and the connection part are integrally formed.

[4] According to a valve in an embodiment of the present invention, a valve includes: at least a dual tubular structure having a through hole; and a diaphragm member having a thin film which is disposed to cover one end of a first tube of the tubular structure and an anchor part which is formed integrally with the thin film and is located between an inner wall of a second tube and an outer wall of the first tube of the tubular structure.

[5] A fluid device in an embodiment of the present invention includes: the valve; and a fluid path in which the valve is provided.

[6] A fluid device in an embodiment of the present invention includes: a plurality of valves, wherein at least one of the plurality of valves has a height of the thin film which is different from that of the other valves.

[7] A fluid device in an embodiment of the present invention includes: a first substrate which includes the valve and in which the diaphragm member is exposed to a first surface; and a second substrate having a second surface in which a fluid path is formed, wherein the first surface faces the second surface, and the first substrate is bonded to the second substrate such that the fluid path crosses a portion which is just above the diaphragm member.

[8] A method for controlling a fluid in an embodiment of the present invention is a method for controlling a fluid in the fluid device, in which the anchor part is not deformed while being fixed, and the thin film is deformed to project toward the fluid path side or the side which is opposite to the fluid path.

[9] A method for controlling a fluid in an embodiment of the present invention includes: arranging a valve, which includes a tubular structure having an outer tube and an inner tube and a diaphragm member having a thin film disposed to cover one end of the inner tube and an anchor part which encircles a peripheral edge of the thin film and comes into close contact with an inner wall of the outer tube and an outer wall of the inner tube in a fluid path; causing the anchor part not to be deformed while being fixed; and causing the thin film to be deformed to project toward the fluid path side or the side which is opposite to the fluid path.

[10] A method for manufacturing a valve in an embodiment of the present invention includes: a step of injecting a polymer composition in which a surface tension thereof is $\gamma$, a contact angle thereof with respect to a tubular structure, which includes an outer tube, an inner tube, and a holding member configured to fix a relative position between the outer tube and the inner tube, is $\theta$, and a density thereof is $\rho$ into the tubular structure; a step of flowing the polymer composition, forming a thin film with a height h which is disposed to cover one end of the inner tube and an anchor part with a height H which encircles a peripheral edge of the thin film and comes into close contact with an inner wall of the outer tube and an outer wall of the inner tube, and stopping a flow of the polymer composition at a stage at which an area S1 serving as an area in a cross section C1 which is perpendicular to an axial direction of the tubular structure, which is surrounded by the inner wall of the outer tube and the outer wall of the inner tube, a sum L1 of lengths of the inner wall of the outer tube and the outer wall of the inner tube in the cross section C1, an area S2 serving as an area in the cross section C1, which is surrounded by an inner wall of the inner tube, a length L2 of the inner wall of the inner tube in the cross section C1, h, and H satisfy the following Expression (1); and a step of curing the polymer composition the flow of which has stopped:

$$(\gamma \cos \theta \times L1)/S1 - \rho g \times H = (\gamma \cos \theta \times L2)/S2 - \rho g \times h \quad (1)$$

[in the expression, g indicates acceleration of gravity].

[11] A method for manufacturing a valve in an embodiment of the present invention includes: a step of blocking a first end part of a tubular structure, which has an outer tube and an inner tube, and in which a first end part of the inner tube is disposed at an inner side in an axial direction than a first end part of the outer tube, using a lid member; a step of injecting a raw material of a diaphragm member from a second end part of the tubular structure; a step of forming the diaphragm member which is constituted of a thin film disposed to cover a one end of the inner tube and an anchor part which comes into close contact with an inner wall of the outer tube and an outer wall of the inner tube by solidifying the raw material; and a step of removing the lid member.

Advantageous Effects of Invention

According to the present invention, a valve with excellent durability, a fluid device including the valve, a method for controlling a fluid using the valve, and a method for manufacturing the valve with excellent durability can be provided.

DESCRIPTION OF EMBODIMENTS

Hereinafter, preferred embodiments of a valve serving as a first embodiment of the present invention, a fluid device serving as a second embodiment, a method for controlling a fluid serving as a third embodiment, and a method for manufacturing the valve serving as a fourth embodiment will be described.

[Valve]

Figure 1:
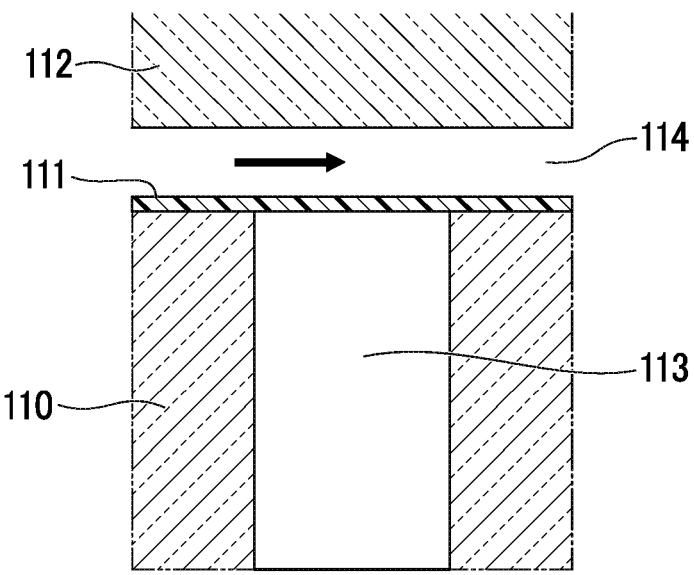
FIG. 1 is a cross-sectional view of a valve having a conventional three-layer structure.
Figure 2:
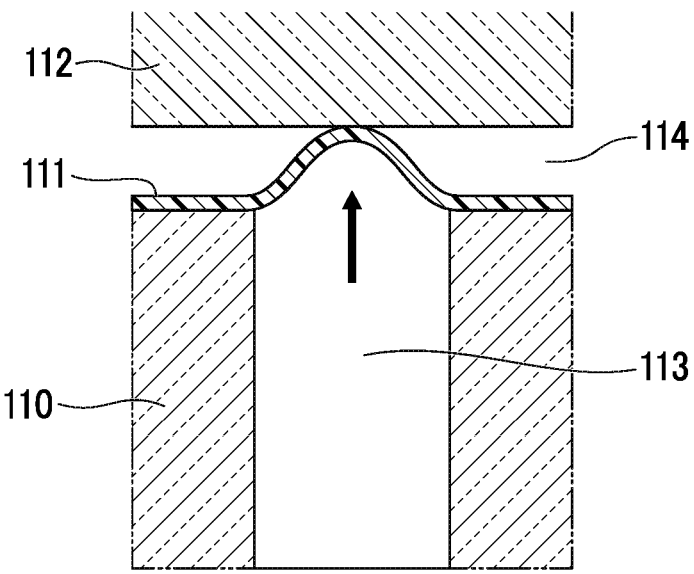
FIG. 2 is a cross-sectional view of the valve having the conventional three-layer structure.
Figure 3:
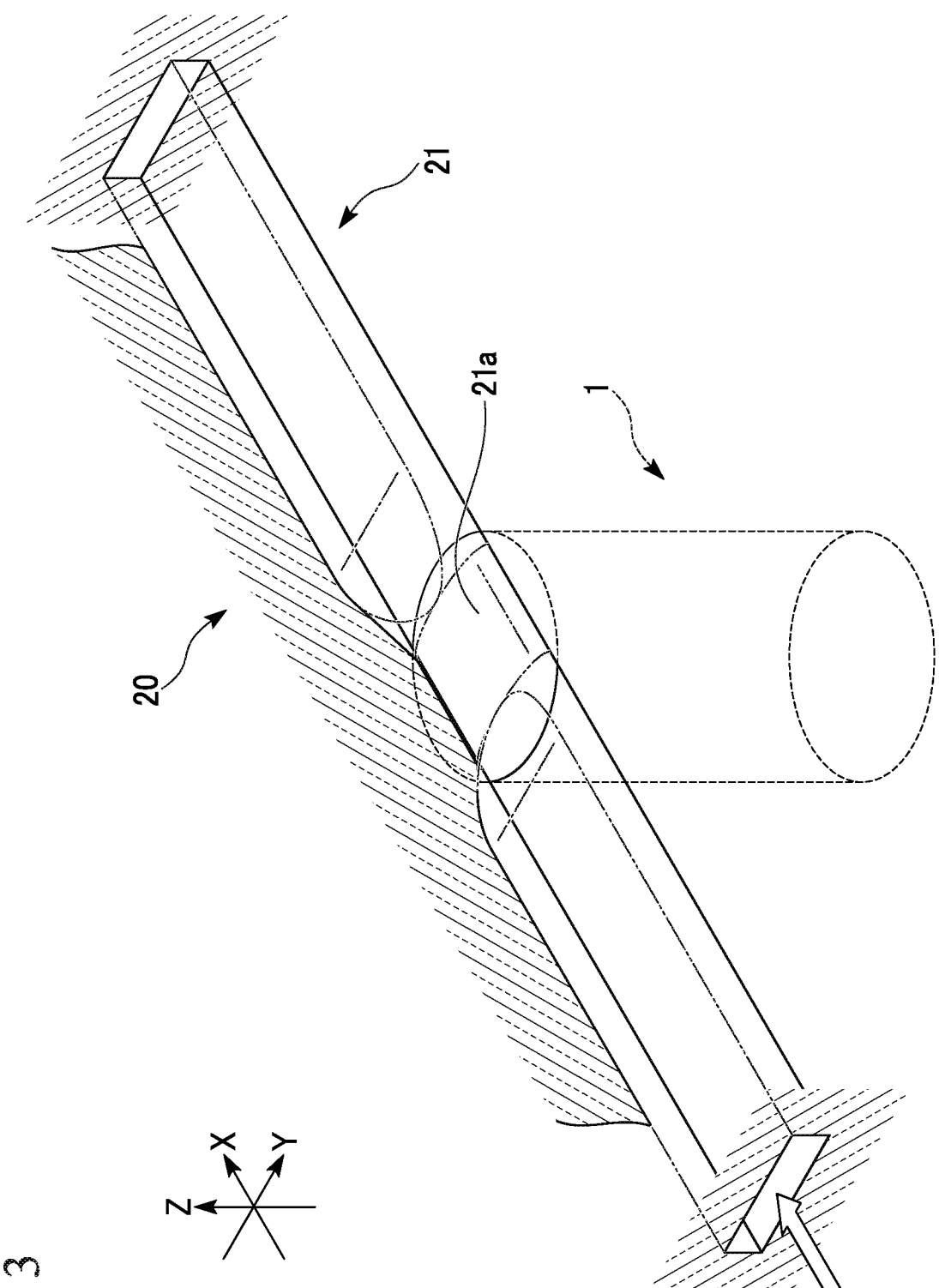
FIG. 3 is a perspective view of a stacked substrate including a valve in an embodiment.

FIG. 3 is an example of a stacked substrate 20 including the valve serving as the first embodiment of the present invention. A fluid such as a liquid and a gas flows through a tunnel-like fluid path 21 provided inside the stacked substrate 20 in a positive direction of an X axis, which is indicated by an arrow in the drawing. A small diameter part 21a in which an inner diameter of the fluid path 21 is smaller than other portions is formed in the middle of the fluid path 21. A valve 1 of this embodiment is arranged, for example, under the small diameter part 21a of the fluid path 21 (in a negative direction of a Z axis in FIG. 3) or at a predetermined position in the fluid path 21.

Also, the valve of this embodiment is a valve which is arranged in a fluid path, and may be a valve which includes a substrate a first surface of which is provided with a hole having an opening and a diaphragm member which is fixed to at least a portion of a wall surface of the hole and at least a central portion of which has a thin film shape, and which controls a flow of a fluid in a fluid path by deforming the diaphragm member.

First Embodiment

Figure 4A:
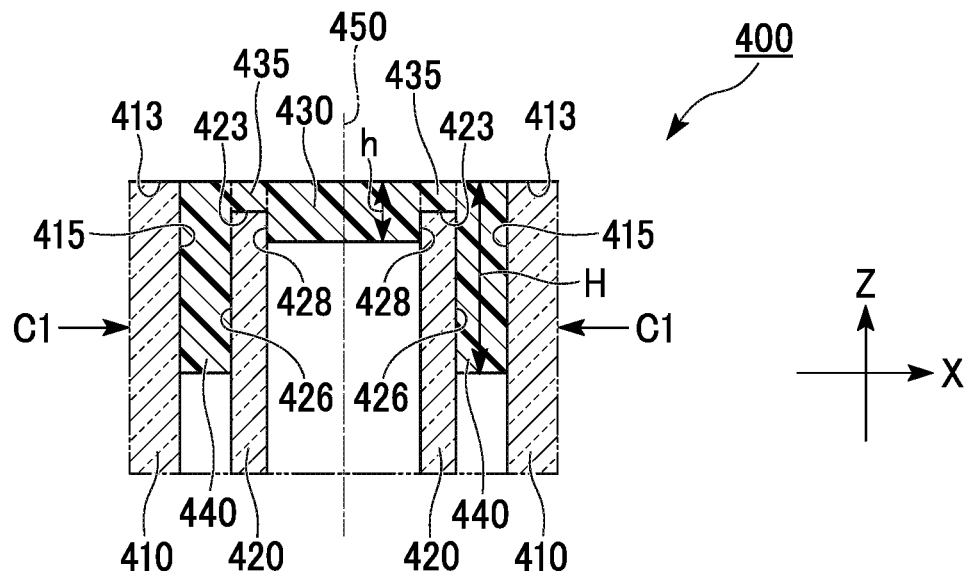
FIG. 4A is a cross-sectional view of a valve of a first embodiment.

FIG. 4A is a cross-sectional view (a cross-sectional view including a central axis 450 which will be described below) of an XZ plane of a valve 400 of the first embodiment. The valve 400 shown in FIG. 4A includes a tubular structure having an outer tube 410 and an inner tube 420, and a diaphragm member having a thin film 430 disposed to cover a first end 423 of the inner tube 420 and an anchor part 440 which encircles a peripheral edge of the thin film 430 and comes into close contact with an inner wall 415 of the outer tube 410 and an outer wall 426 of the inner tube 420.

The outer tube 410 and the inner tube 420 have tubular shapes with the central axis 450 which is common to both. Also, the tubular structure has the central axis 450. The inner wall 415 of the outer tube 410 may be an inner wall of a hole which opens in a substrate. In other words, an inner wall of the outer tube 410 may be integrated with the substrate.

Also, shapes of the outer tube 410 and the inner tube 420 which constitute at least a dual (two-layered) tubular structure are not particularly limited. Here, the shapes may be, for example, a cylinder, and may be a polyangular tube such as a triangular tube, a quadrangular tube, an hexangular tube. The outer tube 410 and the inner tube 420 may have the same shape or different shapes.

Figure 4B:
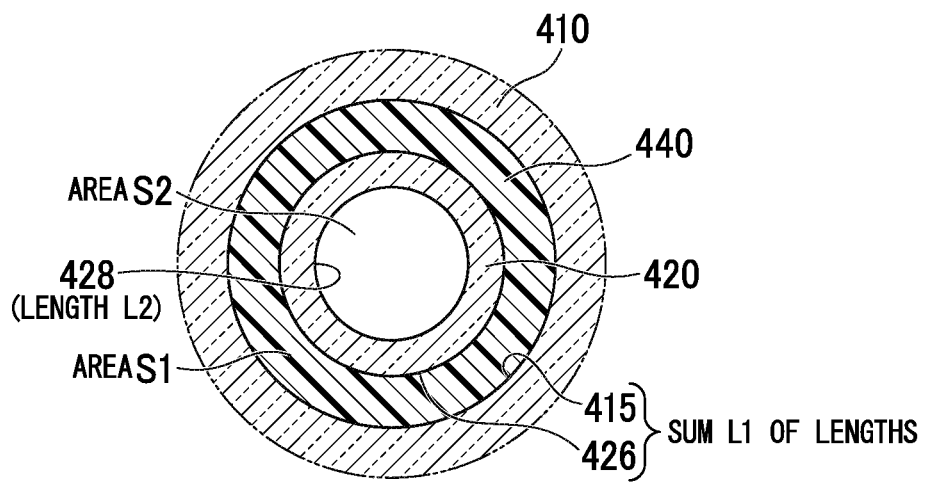
FIG. 4B is a cross-sectional view taken along line C1-C1 of FIG. 4A.
Figure 4C:
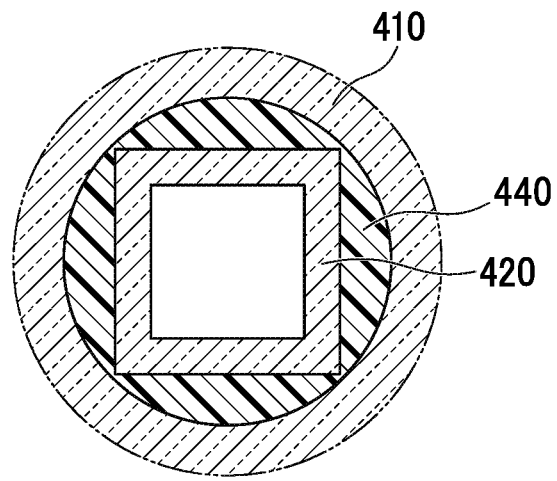
FIG. 4C is a cross-sectional view taken along line C1-C1 of FIG. 4A.
Figure 4D:
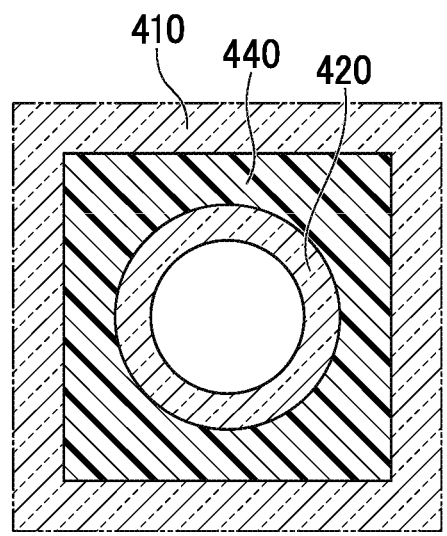
FIG. 4D is a cross-sectional view taken along line C1-C1 of FIG. 4A.
Figure 4E:
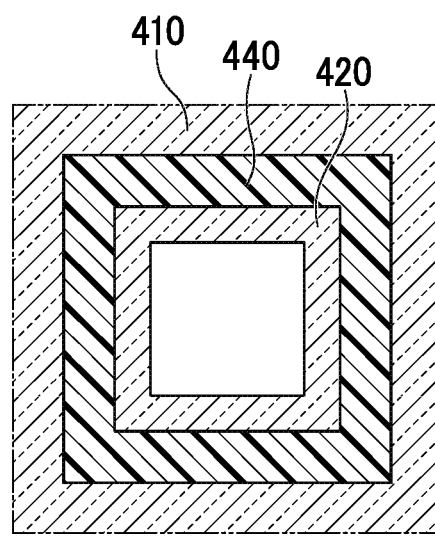
FIG. 4E is a cross-sectional view taken along line C1-C1 of FIG. 4A.

FIGS. 4B to 4E are cross-sectional views taken along line C1-C1 of FIG. 4A (hereinafter, cross sections taken along line C1-C1 are referred to as a cross section C1 in some cases). For example, the cross section C1 includes a surface which is perpendicular to an axial direction of the central axis 450, which is described above, and includes surfaces in the tubular structure and the diaphragm member, which pass through the outer tube 410, the inner tube 420, and the anchor part 440. FIG. 4B shows an example in which both of the outer tube 410 and the inner tube 420 are cylinders. FIG. 4C shows an example in which the outer tube 410 is a cylinder and the inner tube 420 is a quadrangular tube. FIG. 4D shows an example in which the outer tube 410 is a quadrangular tube and the inner tube 420 is a cylinder. FIG. 4E shows an example in which both of the outer tube 410 and the inner tube 420 are quadrangular tubes. Note that, here, the cylinder includes a tubular structure or a rod-like hollow structure a cross-sectional shape of which is a circular shape or an elliptical shape. Also, the triangular tube, the quadrangular tube, and the hexangular tube include a tubular structure or a rod-like hollow structure a cross-sectional shape of which is a triangular shape, a quadrangular shape, or a hexangular shape. For example, in the cross section C1, a cross section of an outer tube is similar in shape to a cross section of an inner tube. For example, in the cross section C1, a cross section of an anchor part is similar in shape to a cross section of at least one of a cross section of an outer tube and a cross section of an inner tube.

A material of the diaphragm member has elasticity and is, for example, an elastomer. A material including a polymer compound can be applied as the elastomer. Examples of materials for the elastomer constituting the diaphragm member include polydimethylsiloxane (PDMS) and silicone elastomers.

The anchor part 440 of the diaphragm member encircles the peripheral edge of the thin film 430 and has a function of anchoring the diaphragm member by coming into close contact with the inner wall 415 of the outer tube 410 and the outer wall 426 of the inner tube 420. Thus, the diaphragm member is firmly fixed to the tubular structure. Also, the thin film 430 of the diaphragm member comes into close contact with an inner wall 428 of the inner tube 420, and the diaphragm member is fixed to the tubular structure at the close contact portion. An inner wall surface of the inner tube, an outer wall surface of the inner tube, and an inner wall surface of the outer tube are a series of continuous surfaces. Surfaces of the anchor part, which are in contact with the outer wall surface of the inner tube, are a series of surfaces. For example, a surface of the anchor part, which is at the inner tube side, is one surface which is continuous along the outer wall surface of the inner tube. Surfaces of the anchor part, which are in contact with the inner wall surface of the outer tube, are a series of surfaces. For example, a surface of the anchor part, which is at the inner tube side, is one surface which is continuous along the outer wall surface of the inner tube. The anchor part is formed to cover the entire outer wall surface of the inner tube in a circumferential direction thereof.

The thin film 430 and the anchor part 440 are connected to each other and are formed continuously and integrally with each other. In an example of FIG. 4A, there is a connecting part 435 between the thin film 430 and the anchor part 440. The thin film 430, the connecting part 435, and the anchor part 440 are integrally formed of the same material.

The first end 423 of the inner tube 420 disposed to be covered by the thin film 430 is disposed at a position which is further inward in an axial direction of the tubular structure than a first end 413 of the outer tube 410. The first end 423 of the inner tube 420 is disposed farther from a portion of the diaphragm member, which is exposed with respect to a fluid path of a fluid device to be described below, in the axial direction of the tubular structure than the first end 413 of the outer tube 410. As shown in FIG. 4A, a space generated due to this disposition is formed with the connecting part 435. The connecting part 435 comes into close contact with and is fixed to a surface of the first end 413 of the inner tube 420.

The second end of the inner tube 420 is open to the atmosphere without being covered by the diaphragm member. When the tubular structure includes a holding member (a member configured to fix a relative position between the outer tube and the inner tube) which will be described below, the holding member is disposed at the second end of the inner tube 420. When the valve of this embodiment is fitted into a hole provided in a separate substrate, the second end of the inner tube 420 comes into contact with a bottom surface of the hole.

As shown in examples which will be described below, since the diaphragm member is firmly fixed to the tubular structure in the valve including the structure body of this embodiment, the diaphragm member has extremely excellent durability without being separated even if the valve is repeatedly operated.

Second Embodiment

As shown in FIGS. 4A and 4B, in the valve 400 of the first embodiment, the thin film 430 has a height h, the anchor part 440 has a height H, and the above-described diaphragm member is formed by curing a polymer composition. In addition, when a surface tension of the polymer composition is γ, a contact angle thereof with respect to the above-described tubular structure is θ, and a density thereof is ρ, an area S1 serving as an area in a cross section C1 (a cross section taken along line C1-C1) which is perpendicular to an axial direction Z (an axial direction of the central axis 450) of the tubular structure, which is surrounded by the inner wall 415 of the outer tube 410 and the outer wall 426 of the inner tube 420, a sum L1 of lengths of the inner wall 415 of the outer tube and the outer wall 426 of the inner tube in the cross section C1, an area S2 serving as an area in the cross section C1, which is surrounded by the inner wall 428 of the inner tube 420, a length L2 of the inner wall 428 of the inner tube 420 in the cross section C1, the height (a height in the axial direction Z of the tubular structure and a film thickness of a thin film) h of the thin film 430, and the height (a height in the axial direction Z of the tubular structure) H of the anchor part 440 may satisfy the following Expression (1). Note that the technical meaning of Expression (1) will be described below:

$$(\gamma \cos \theta \times L1)/S1 - \rho g \times H = (\gamma \cos \theta \times L2)/S2 - \rho g \times h \quad (1)$$

[in the expression, g indicates acceleration of gravity].

Note that the shapes of the outer tube 410 and the inner tube 420, which are shown in FIG. 4B, are merely examples. Also in this embodiment, as in the first embodiment, the shapes of the outer tube 410 and the inner tube 420 are not particularly limited. However, the shapes thereof may be, for example, a cylinder, and may be a polyangular tube such as a triangular tube, a quadrangular tube, and a hexangular tube. Also, the outer tube 410 and the inner tube 420 may have the same shape, a similar shape, or different tubular shapes.

Also, since Expression (1) is a model formula, values obtained from this expression (1) are likely to fall in a range outside of measured values in experiments. The expression "satisfy Expression (1)" in this specification means that values (theoretical values) of H−h, which are calculated on the basis of Expression (1), and measured values of H−h satisfy the following Expression (A1). For example, in Expression (A1), α is preferably 20, is more preferably 10, and is even more preferably 5.

[Math. 1] (A1)

$$\left| 100 - \frac{\text{Actually measured value}}{\text{Theoretical value}} \times 100 \right| \leq \alpha$$

Here, Expression (A1) is reworked as follows. First, if Expression (1) is changed, Expression (A2) is obtained.

[Math. 2]

$$H - h = \frac{\gamma \cos \theta}{\rho g} \left( \frac{L1}{S1} - \frac{L2}{S2} \right) \quad (A2)$$

Thus, when Expression (A2) is substituted into Expression (A2), Expression (A3) is obtained.

[Math. 3]

$$\left| 100 - \frac{H - h}{\frac{\gamma \cos \theta}{\rho g} \left( \frac{L1}{S1} - \frac{L2}{S2} \right)} \times 100 \right| \leq \alpha \quad (A3)$$

For example, in the valve 400 of the first embodiment, the thin film 430 has a height h, the anchor part 440 has a height H, and the above-described diaphragm member is formed by curing a polymer composition. In addition, when a surface tension of the polymer composition is γ, a contact angle thereof with respect to the above-described tubular structure is θ, and a density thereof is ρ, an area S1 serving as an area in a cross section C1 (a cross section taken along line C1-C1) which is perpendicular to the axial direction Z of the tubular structure, which is surrounded by the inner wall 415 of the outer tube 410 and the outer wall 426 of the inner tube 420, a sum L1 of lengths of the inner wall 415 of the outer tube and the outer wall 426 of the inner tube in the cross section C1, an area S2 serving as an area in the cross section C1, which is surrounded by the inner wall 428 of the inner tube 420, a length L2 of the inner wall 428 of the inner tube 420 in the cross section C1, the height (a height in the axial direction Z of the tubular structure and a film thickness of a thin film) h of the thin film 430, and the height (a height in the axial direction Z of the tubular structure) H of the anchor part 440 may satisfy the following Expression (A3). In the following Expression (A3), α is preferably 20, is more preferably 10, and is further more preferably 5.

[Math. 4]

$$\left| 100 - \frac{H - h}{\frac{\gamma \cos \theta}{\rho g} \left( \frac{L1}{S1} - \frac{L2}{S2} \right)} \times 100 \right| \leq \alpha \quad (A3)$$

[in the expression, g indicates acceleration of gravity].

As will be described above, the valve of this embodiment can be easily manufactured and has excellent durability.

Third Embodiment

Figure 5:
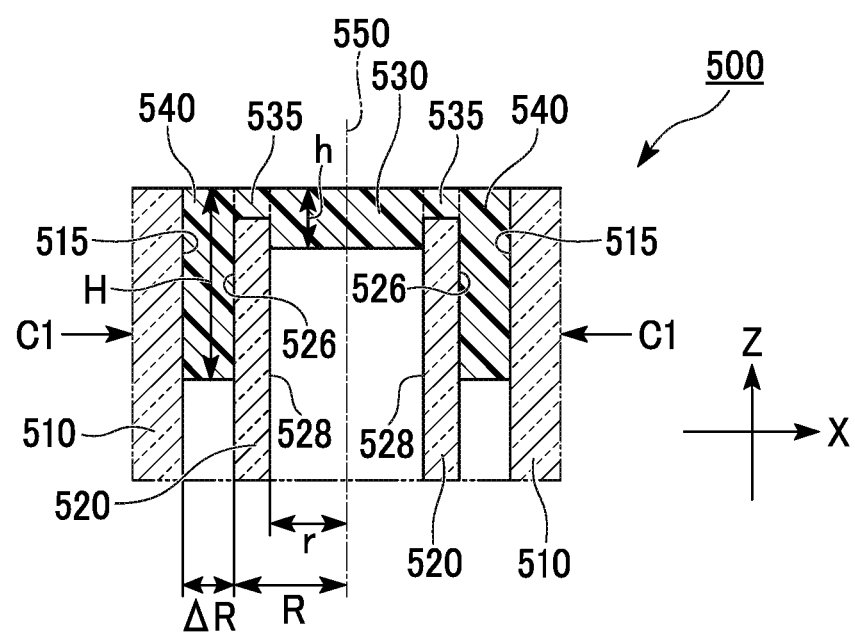
FIG. 5 is a cross-sectional view of a valve in a third embodiment.

Both of the outer tube and the inner tube may be cylinder shapes in the valve of the second embodiment. FIG. 5 is a cross-sectional view (a cross-sectional view including an axis of the tubular structure) of an XZ plane of a valve 500 of a third embodiment. In the valve 500, an inner tube 520 has a cylinder shape of an inner diameter 2r and an outer diameter 2R, and an outer tube 510 has a cylinder shape of an inner diameter 2(R+ΔR). An area S1 of the region, in a cross section C1 (a cross section taken along line C1-C1) which is perpendicular to an axial direction Z of a tubular structure, surrounded by an inner wall 515 of the outer tube 510 and an outer wall 526 of the inner tube 520 is expressed as $S1=\pi\{(R+\Delta R)^2-R^2\}$, a sum L1 of lengths of the inner wall 515 of the outer tube and the outer wall 526 of the inner tube in the cross section C1 is expressed as $L1=2\pi\{(R+\Delta R)+R\}$, an area S2 of the region, in the cross section C1, surrounded by an inner wall 528 of the inner tube 520 is expressed as $S2=\pi r^2$, and a length L2 of the inner wall 528 of the inner tube 520 in the cross section C1 is expressed as $L2=2\pi r$. A height (a height in an axial direction Z of a tubular structure and a film thickness of a thin film) h of a thin film 530 and a height (a height in the axial direction Z of the tubular structure) H of an anchor part 540 then satisfy the following Expression (2). Expression (2) is obtained by changing the above-described Expression (1) when the outer tube and the inner tube have the cylinder shapes:

$$(\gamma\cos\theta\times 2\pi\{(R+\Delta R)+R\})/\pi\{(R+\Delta R)^2-R^2\}-\rho g\times H=(\gamma\cos\theta\times 2\pi r)/\pi r^2-\rho g\times h \quad (2)$$

[in the expression, g indicates acceleration of gravity].

Also, since Expression (2) is a model formula, values obtained from this expression (2) are likely to fall a range outside of measured values in experiments. The expression "satisfy Expression (2)" in this specification means that values (theoretical values) of H–h, which are calculated on the basis of Expression (2), and measured values of H–h satisfy the following Expression (A1). For example, in Expression (A1), α is preferably 20, is more preferably 10, and is further more preferably 5.

[Math. 5]

$$\left|100-\frac{\text{Actually measured value}}{\text{Theoretical value}}\times 100\right|\leq\alpha \quad (A1)$$

Here, Expression (A1) is reworked as follows. First, if Expression (2) is changed, Expression (C7) is obtained.

[Math. 6]

$$H-h=\frac{2\gamma\cos\theta}{\rho g}\left(\frac{1}{\Delta R}-\frac{1}{r}\right) \quad (C7)$$

Thus, when Expression (C7) is substituted into Expression (A1), Expression (A3) is obtained.

[Math. 7]

$$\left|100-\frac{H-h}{\frac{2\gamma\cos\theta}{\rho g}\left(\frac{1}{\Delta R}-\frac{1}{r}\right)}\times 100\right|\leq\alpha \quad (A4)$$

For example, in the valve 500 of the third embodiment, the inner tube 520 has the cylinder shape of the inner diameter 2r and the outer diameter 2R, the outer tube 510 has the cylinder shape of the inner diameter $2(R+\Delta R)$, the area S1 serving as the area in the cross section C1 (the cross section taken along line C1-C1) which is perpendicular to the axial direction Z of the tubular structure, which is surrounded by the inner wall 515 of the outer tube 510 and the outer wall 526 of the inner tube 520, may satisfy $S1=\pi\{(R+\Delta R)^2-R^2\}$, the sum L1 of the lengths of the inner wall 515 of the outer tube and the outer wall 526 of the inner tube in the cross section C1 may satisfy $L1=2\pi\{(R+\Delta R)+R\}$, the area S2 serving as the area in the cross section C1, which is surrounded by the inner wall 528 of the inner tube 520, may satisfy $S2=\pi r^2$, the length L2 of the inner wall 528 of the inner tube 520 in the cross section C1 may satisfy $L2=2\pi r$, and the height (the height in the axial direction Z of the tubular structure and the film thickness of the thin film) h of the thin film 530 and the height (the height in the axial direction Z of the tubular structure) H of the anchor part 540 may satisfy the following Expression (A4). In Expression (A4), α is preferably 20, more preferably 10, and further more preferably 5.

[Math. 8]

$$\left|100-\frac{H-h}{\frac{2\gamma\cos\theta}{\rho g}\left(\frac{1}{\Delta R}-\frac{1}{r}\right)}\times 100\right|\leq\alpha \quad (A4)$$

[in the expression, g indicates acceleration of gravity].

Fourth Embodiment

The valve of the above-described third embodiment is arranged in the fluid path, and r and ΔR, which are described above, may satisfy the following Expression (a).

$$\Delta R<r \quad (a)$$

Expression (a) is obtained by changing the above-described Expression (2). Also, Expression (2) can be changed to Expression (C7) as will be described below.

[Math. 9]

$$H-h=\frac{2\gamma\cos\theta}{\rho g}\left(\frac{1}{\Delta R}-\frac{1}{r}\right) \quad (C7)$$

Here, with regard to the valve of this embodiment, H–h>0 may be satisfied. For example, the height H of the anchor part 540 may be greater than the height h of the thin film 530. It can be understood based on the above-described Expression (C7) that conditions, from which H–h>0 is obtained, include cos θ>0, for example, the fact that a contact angle θ of a polymer composition serving as a material of the diaphragm member with respect to the tubular structure is in a range of 0<θ<90° and the fact that the following Expression (C8) is satisfied.

[Math. 10]

$$\frac{1}{\Delta R}>\frac{1}{r} \quad (C8)$$

When the above-described Expression (C8) is changed, the following Expression (a) is obtained. For example, in the valve of this embodiment, ΔR which is described above is smaller than r which is described above. Note that, as shown in FIG. 5, ΔR indicates a distance from the inner wall 515 of the outer tube 510 to the outer wall 526 of the inner tube 520, and r indicates a radius of a circle which is formed by the inner wall 528 of the inner tube 528.

$$\Delta R<r \quad (a)$$

[Fluid Device]

A fluid device of this embodiment is a fluid device including at least one valve, which is described above. Note that a fluid path and the valve constituting the fluid device of this embodiment may have a micrometer scale or a millimeter scale. A fluid device having any scale can also be referred to as a "micro fluid device" in consideration of the fact that the fluid device is a device having a minute fluid path.

The fluid device is, for example, a fluid device which includes the above-described valve, a first substrate with a first surface to which a diaphragm member is exposed, and a second substrate with a second surface in which a fluid path is formed, and in which the first surface is opposite to the second surface and the first substrate is bonded to the second substrate such that the fluid path crosses a portion which is just above the diaphragm member.

Figure 6A:
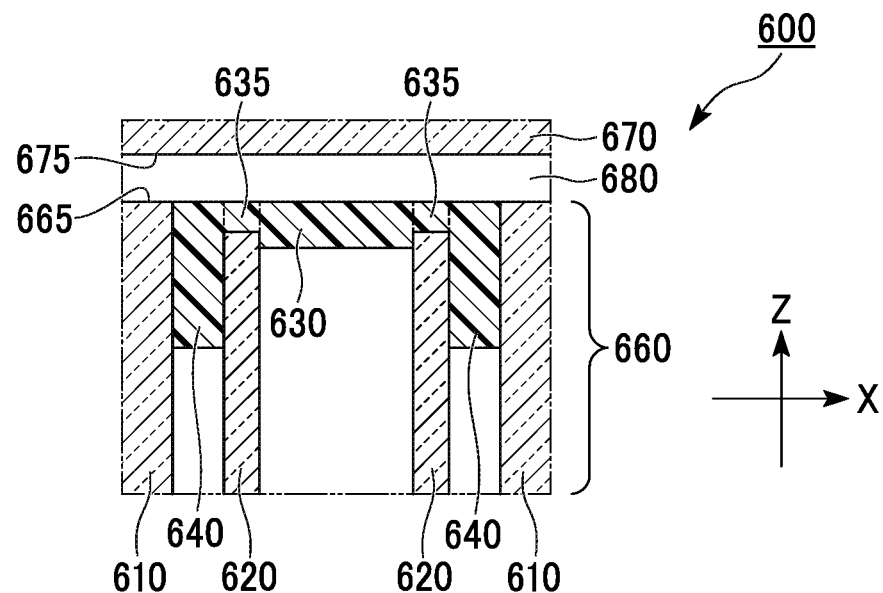
FIG. 6A is a cross-sectional view of a fluid device in an embodiment.

FIG. 6A is a cross-sectional view (a cross-sectional view including an axis of a tubular structure) of an XZ plane of a fluid device 600 related to an embodiment. The fluid device 600 includes a first substrate 660 and a second substrate 670, the first substrate 660 includes a valve having a tubular structure with an outer tube 610 and an inner tube 620 and a diaphragm member with a thin film 630, an anchor part 640, and a connection part 635, and the diaphragm member is exposed to a first surface 665 of the first substrate 660. Also, the second substrate 670 has a second surface 675 in which a fluid path 680 is formed. The first surface 665 is opposite to the second surface 675, and the first substrate 660 is bonded to the second substrate 670 such that the fluid path 680 crosses a portion which is just above the diaphragm member so that the fluid device 600 is formed.

The fluid device of this embodiment includes a plurality of valves, which are described above, and at least one of the plurality of valves may have a height h of a thin film (a thickness of the thin film) which is different from those of the other valves.

Figure 13:
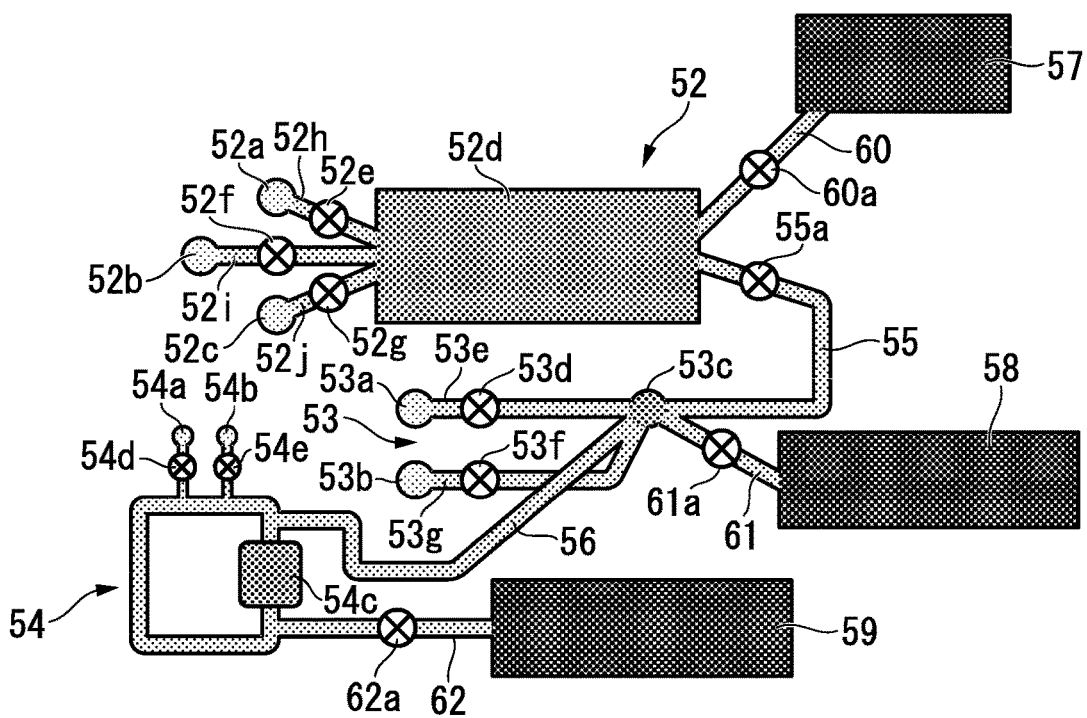
FIG. 13 is a schematic diagram of a fluid device in an embodiment.

Examples of such a fluid device include, for example, the fluid device shown in FIG. 13. In FIGS. 13, 52e, 52f, 52g, 53d, 53f, 55a, 60a, 61a, and 62a correspond to the above-described valves.

Thicknesses of thin films in the valves may not all be the same. All or some of the thicknesses of the thin films in the valves may differ.

The thicknesses of thin films of valves are set to have a different thickness for each valve so that a plurality of valves which are provided in fluid paths with different sizes can be controlled by the same pressure. Alternatively, when valves are controlled by the same pressure by setting thicknesses of thin films of the valves to have a different thickness for each valve, flow rates of a fluid, which flows in fluid paths, can also be changed for each valve.

Figure 20A:
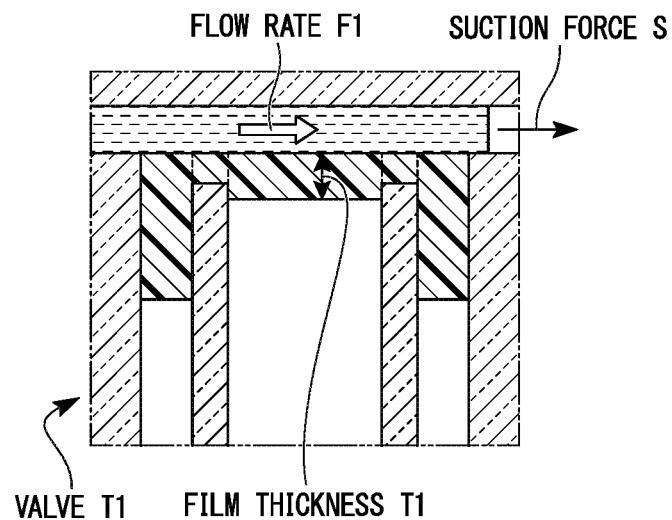
FIG. 20A is a view showing an operation of a fluid device including valves having differing thicknesses of thin films in an embodiment.

FIGS. 20A to 20D are views showing operations of a fluid device having differing valve thicknesses of thin films. FIG. 20A is a view of the fluid device including a valve T1 related to an embodiment. In FIG. 20A, a suction force S is applied to a fluid path so that a fluid in the fluid path moves at a flow rate F1.

Figure 20B:
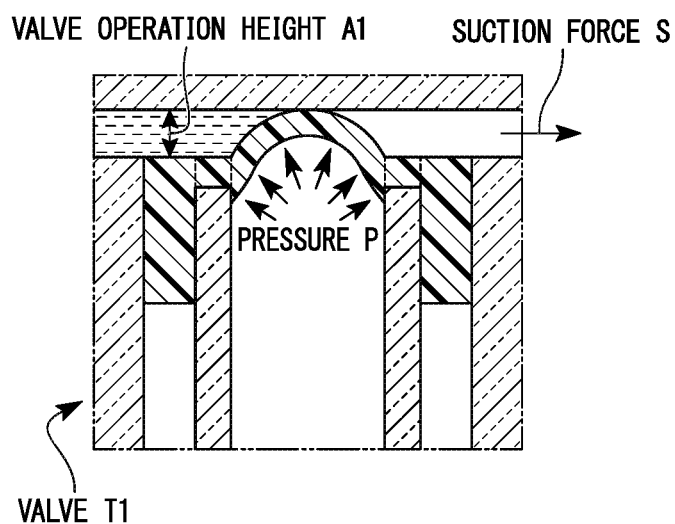
FIG. 20B is a view showing an operation of the fluid device including the valves having differing thicknesses of the thin films in an embodiment.

Here, as shown in FIG. 20B, when a pressure P is applied to an inside (an internal space) of an inner tube of the valve T1, a thin film of the valve T1 is deformed. A valve operation height A1 at this time coincides with a height of the fluid path. Thus, the fluid path is fully blocked so that movement of the fluid, which moves at the flow rate F1, can be caused to stop.

Figure 20C:
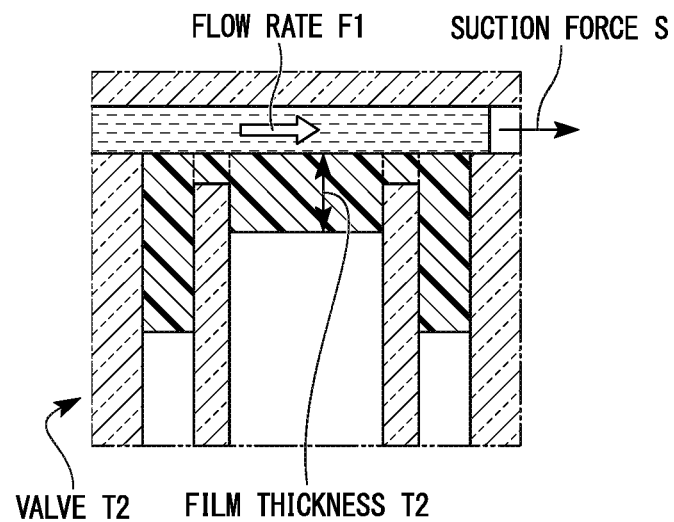
FIG. 20C is a view showing an operation of the fluid device including the valves having differing thicknesses of thin films in an embodiment.

FIG. 20C is a view of the fluid device including a valve T2 which has a thickness of a thin film which is thicker than that of the valve T1 and in which other conditions are the same as those for the valve T1. In FIG. 20C, the suction force S is applied to a fluid path so that a fluid in the fluid path moves at a flow rate F1.

Figure 20D:
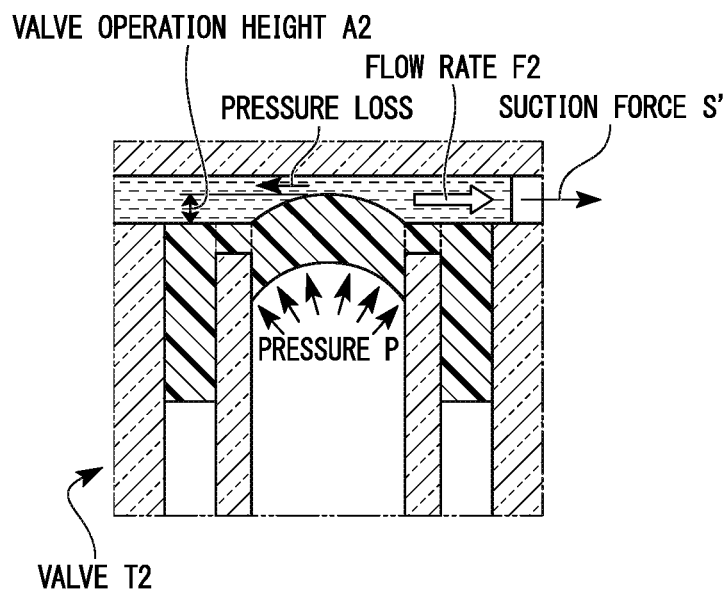
FIG. 20D is a view showing an operation of the fluid device including the valves having differing thicknesses of the thin films in an embodiment.

Here, as shown in FIG. 20D, when the pressure P is applied to an inside (an internal space) of an inner tube of the valve T2, a thin film of the valve T2 is deformed. However, since the valve T2 has a thickness of the thin film which is thicker than that of the valve T1, the thin film of the valve T2 is deformed up to a valve operation height A2, but does not fully close the fluid path. Also, since the fluid passes through a micro space formed by a fluid path wall surface and the thin film of the valve T2, pressure loss occurs due to a frictional force generated at an interface between the fluid and the wall surface and surface tension, and the suction force S is thus attenuated to suction force S'. As a result, the fluid in the fluid path moves at a flow rate F2 occurring due to the suction force S'.

As described above, the valve operation height A2 is adjusted by controlling a thickness of a film thickness portion of the valve T2 so that the flow rate F2 can be arbitrarily set. Also, the valve T1 can play a part in a function as a liquid-feeding-stop valve, and the valve T2 can play a part in a function as a flow rate control valve without changing the suction force S and the pressure P for each valve.

<Pump Function>

The fluid device of this embodiment may serve as a pump which includes a plurality of valves, in which the plurality of valves are serially arranged in the fluid path, and which causes a fluid in the fluid path to flow using opening/closing of the plurality of valves.

Also, in the fluid device of this embodiment, for example, the plurality of valves may be controlled such that they open/close in synchronization with each other so that waves occur in the fluid in the fluid path, and thus the fluid can flow in a predetermined direction (for example, one direction in which the fluid flows). For example, the fluid in the fluid path can preferably be fed in a predetermined direction through preferably two or more valves and more preferably three or more valves, which are serially arranged in the fluid path, by a so-called peristaltic method in which a time at which each valve body (a diaphragm member) is deformed is shifted at predetermined intervals so that each valve is controlled such that it opens/closes. Three or more valves are used so that a liquid feeding direction of the fluid can be controlled. Types and operating methods (a normally open method, a normally closed method, and the like) of the valves which are arranged in the fluid path may be the same or different.

<Detection of Biomolecules>

Lipid vesicles called exosomes are well known and have been attracting attention in recent years. Exosomes are, for example, lipid vesicles with diameters of about 30 to 100 nm, which are secreted from cells, and contain biomolecules, for example, proteins, nucleic acids, miRNA, and the like, which are derived from cells serving as secreting sources. Specific proteins, nucleic acids, miRNA, and the like are expressed inside cell membranes of abnormal cells such as cancer cells in a living body.

For this reason, abnormality of cells serving as secreting sources of exosomes can be detected by analyzing biomolecules contained in the exosomes. Examples of a means for taking out (extracting) the biomolecules contained in the exosomes include lysis of lipid bilayer membranes of the exosomes and the like.

Also, since exosomes are detected in a body fluid such as blood, urine, saliva, and the like which circulate in a living body, abnormality in a living body can be detected by analyzing these exosomes even if a biopsy examination is not performed.

The above-described fluid device can be used for analyzing exosomes. For example, the above-described fluid device may be a fluid device configured to detect biomolecules contained in exosomes in a sample. Examples of such a fluid device include a fluid device which has the above-described valves, an exosome purifying part having a layer modified by a compound with hydrophobic chains and hydrophilic chains, and a biomolecule detecting part.

Figure 11:
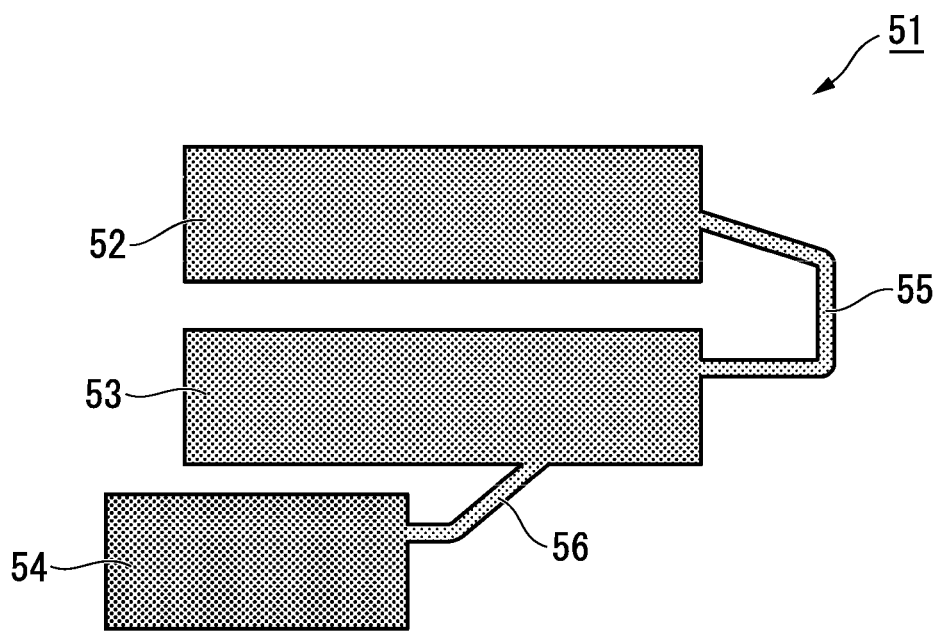
FIG. 11 is a schematic diagram of a fluid device in an embodiment.

Examples of the fluid device of this embodiment include a fluid device 51 shown in FIG. 11. The fluid device 51 is a fluid device configured to detect biomolecules contained in exosomes in a sample, and includes an exosome purifying part 52 configured to have a layer modified by a compound with hydrophobic chains and hydrophilic chains, a biomolecule purifying part 53, a biomolecule detecting part 54, a first fluid path 55 configured to connect the exosome purifying part 52 to the biomolecule purifying part 53, a second fluid path 56 configured to connect the biomolecule purifying part 53 to the biomolecule detecting part 54, and the valves in the above-described embodiment, which are arranged at desired places in the fluid paths.

The fluid device 51 of this embodiment is a device configured to obtain a sample including plasma obtained by removing blood cells from blood and to detect biomolecules contained in exosomes in a sample supplied to the exosome purifying part 52.

In this embodiment, the first fluid path 55 is a fluid path through which a lysis solution for the exosomes is fed from the exosome purifying part 52 to the biomolecule purifying part 53, and the second fluid path 56 is a fluid path through which a solution including purified biomolecules is fed to the biomolecule detecting part 54.

Figure 12:
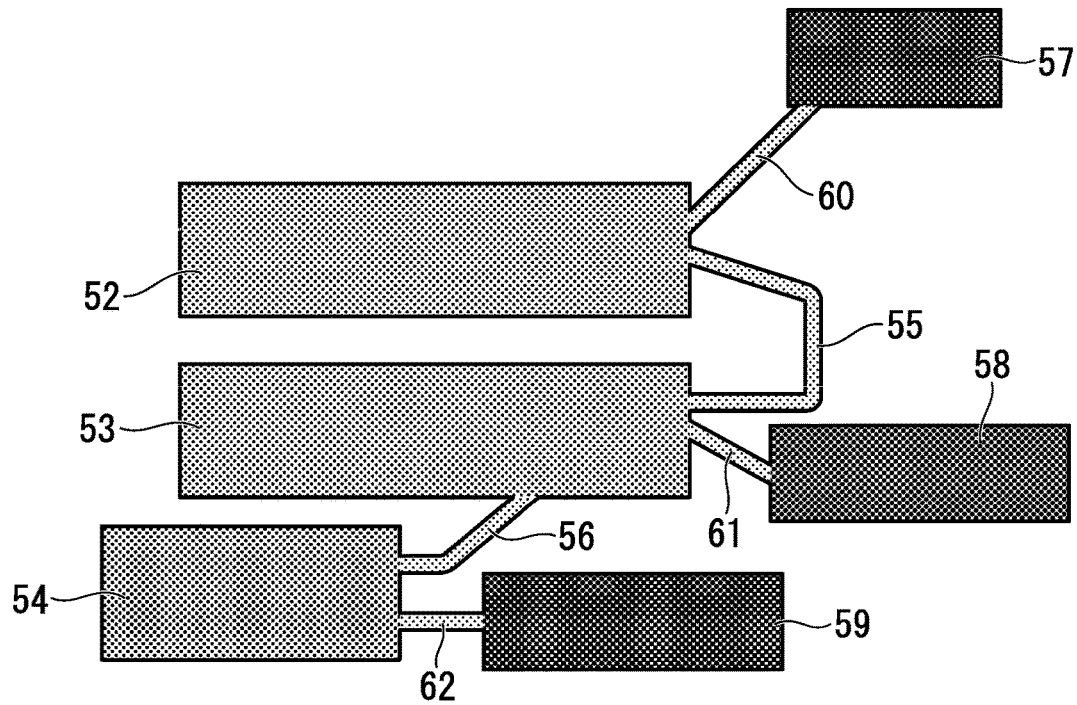
FIG. 12 is a schematic diagram of a fluid device in an embodiment.

From the viewpoint of preventing a secondary infection due to a sample used for analysis, for example, as shown in FIG. 12, the fluid device 51 of this embodiment may further include waste liquid tanks 57, 58, and 59. Note that FIG. 12 shows three waste liquid tanks, but these may be combined into one waste liquid tank or two waste liquid tanks.

An example of each constitution in the fluid device 51 of this embodiment will be described with reference to FIG. 13. The exosome purifying part 52 is configured to fix exosomes included in a supplied sample and to lyse the exosomes, and includes an inlet and an exosome fixing part 52d having a layer modified by a compound with hydrophobic chains and hydrophilic chains. As shown in FIG. 13, the exosome purifying part 52 preferably includes an inlet for each reagent to be introduced. For example, the exosome purifying part 52 preferably includes a sample introducing inlet 52b and a lysis solution introducing inlet 52c, and more preferably includes a cleaning solution introducing inlet 52a.

In the fluid device 51 of this embodiment, a liquid in parts may be driven by an external suction pump, and a flow of the liquid may be controlled by opening/closing the valve serving as the first aspect of the present invention.

As shown in FIG. 13, when exosomes are analyzed, first, in the above-described exosome purifying part, a sample including plasma is injected into the sample introducing inlet 52b, and the sample is introduced into the exosome fixing part 52d through suction by opening a valve 52f of a fluid path 52i.

The exosomes in the sample introduced into the exosome fixing part 52d are captured by a compound with hydrophobic chains and hydrophilic chains. Here, the compound with the hydrophobic chains and the hydrophilic chains in the exosome fixing part 52d is a compound having hydrophobic chains binding to a lipid bilayer membrane and hydrophilic chains dissolving lipid chains. Exosomes with a lipid bilayer membrane can be fixed to the exosome fixing part 52d using an associated compound.

Note that the expression "exosomes are fixed to the exosome fixing part 52d" in this specification includes adsorbing exosomes on an exosome fixing part. Thus, the exosomes can be isolated from a sample.

Examples of a substrate used for the exosome fixing part 52d include a glass substrate, a silicon substrate, a polymer substrate, a metallic substrate, and the like. With regard to the substrate, a compound with hydrophobic chains and hydrophilic chains may be bound to a surface of the substrate via a material bound to the hydrophilic chains of the compound. For example, examples of the material can include a material with an amino group, a carboxyl group, a thiol group, a hydroxyl group, or an aldehyde group, and an example is preferably 3-aminopropyltriethoxysilane.

Note that extracellular vesicles such as microvesicles and apoptotic bodies are contained in plasma in addition to exosomes, and the extracellular vesicles are also likely to be fixed to the exosome fixing part 52d. From the viewpoint of removing the extracellular vesicles from the exosome fixing part 52d, the exosomes on the exosome fixing part 52d are preferably cleaned.

Subsequently, the exosomes fixed to the exosome fixing part 52d are lysed. As shown in FIG. 13, a valve 52g in a fluid path 52j is opened, the lysis solution is injected into the lysis solution introducing inlet 52c, and a lysis solution is introduced into the exosome fixing part 52d through suction. Examples of the lysis solution include a reagent used for cytolysis.

The lysis solution passes through the exosome fixing part 52d so that the exosomes captured on the exosome fixing part 52d are lysed, and thus biomolecules contained in the exosomes are discharged. The biomolecules discharged from the exosomes pass through the first fluid path 55 and are fed to the biomolecule purifying part 53 via a valve 55a.

As shown in FIG. 13, the biomolecule purifying part 53 preferably includes a biomolecule recovering solution introducing inlet 53b and a biomolecule fixing part 53c, and more preferably includes a biomolecule cleaning solution introducing inlet 53a.

In this embodiment, biomolecules fixed by the biomolecule fixing part 53c are preferably miRNA. An exosome lysis solution passes through the biomolecule fixing part 53c so that biomolecules are captured on the biomolecule fixing part 53c.

Subsequently, the biomolecules fixed to the biomolecule fixing part 53c are eluted. As shown in FIG. 13, a valve 53f of a fluid path 53g is opened, the biomolecule recovering solution is injected into the biomolecule recovering solution introducing inlet 53b, and a biomolecule recovering solution is introduced into the biomolecule fixing part 53c.

Subsequently, the biomolecules are recovered from the biomolecule fixing part 53c. The biomolecules pass through the second fluid path 56 and are fed to the biomolecule detecting part 54.

For example, the biomolecule detecting part 54 includes a substrate configured such that a material with an affinity for biomolecules is fixed to the substrate. When the biomolecules are miRNA, a substrate 54c configured such that a probe, which is complementary to target miRNA, is fixed to the substrate 54c is preferably provided. Examples of the substrate to which the probe, which is complementary to the target miRNA, is fixed include a DNA chip or the like.

As shown in FIG. 13, the biomolecule detecting part 54 preferably further includes a cleaning solution introducing inlet 54b.

After the biomolecules are fed to the biomolecule detecting part 54, a valve 54d is opened, and a detecting probe dissolving solution is injected into a detecting probe introducing inlet 54a.

Subsequently, the biomolecules and the detecting probe dissolving solution are mixed while circulating in a biomolecule detecting part.

Subsequently, it is preferable that the substrate (the substrate 54c in FIG. 13) to which the capturing probe is fixed is cleaned and non-specific adsorbed material on the substrate thus removed.

Subsequently, an abundance of the biomolecules captured on the substrate 54c is measured. For example, biomolecules in a sample can be quantified by labeling biomolecules using a labeling substance and measuring an abundance of the labeling substance. Examples of the labeling substance include a fluorescent substance, an enzyme, and the like. For example, the labeling substance may be a fluorescent substance. The biomolecules can be quantified by measuring an intensity of fluorescence generated when the fluorescent substance is irradiated with exciting light. The biomolecules may be labeled using the fluorescent substance in advance. Alternatively, after the biomolecules are captured on the substrate 54c, the biomolecules may be stained, for example, using a fluorescence-labeled antibody or the like. For example, the intensity of the fluorescence in the fluorescent substance can be measured using a controller (not shown) such as a fluorescence microscope, a light source, and a personal computer.

According to this embodiment, for example, an analysis of exosomes which needs one or more days in the related art can be rapidly performed in only about one hour.

After the exosomes are fixed using the exosome purifying part of this device as described above, biomolecules present on surfaces of the exosomes may be detected in the exosome purifying part. A method of detecting the biomolecules present on the surfaces of the exosomes fixed to the substrate includes forming a composite by an interaction of the biomolecules present on the surfaces of the exosomes and first molecules specifically bound to the biomolecules and detecting the composite (a first molecule-exosome composite) on the substrate.

A method of detecting the first molecule-exosome composite includes, for example, a step of detecting fluorescence of a fluorescence-labeled first molecule-exosome composite. Also, a detection method using enzyme-linked immunosorbent assay (ELISA) may be used.

Examples of the interaction of the first molecules and the exosomes include a binding reaction such as, for example, an antigen-antibody reaction. Also, the first molecules are not limited to an antibody, and an aptamer may also be preferably used. Examples of an aptamer include a nucleic acid aptamer and a peptide aptamer.

The biomolecules present on the surfaces of the exosomes and the miRNA contained in the exosomes are detected using this device as described above so that the exosomes can be analyzed in two steps.

According to the fluid device of this embodiment, abnormality in a living body can be detected, for example, by analyzing exosomes in blood circulating in a living body even if a biopsy examination is not performed.

[Method for Controlling Fluid]

A method for controlling a fluid in this embodiment corresponds to the method for controlling the fluid in the fluid device of the above-described embodiment, in which the anchor part of the valve of the above-described embodiment is not deformed while being fixed to the tubular structure and the thin film is deformed to project toward the fluid path side or a side which is opposite to the fluid path.

The method for controlling the fluid in this embodiment may be realized, for example, by a fluid control structure including a substrate which has a first surface configured to come into contact with a fluid and in which a through hole is formed, a valve body which is fitted into an opening in the first surface of the through hole and at least a central portion of which has a thin film shape and is elastically deformable, and a driving part configured to deform the valve body in a direction (a direction which is perpendicular to a direction in which the fluid flows through a fluid path) which is perpendicular to an axis of the fluid path.

In the above-described method for controlling the fluid, a valve, which includes a tubular structure having an outer tube and an inner tube, and a diaphragm member having a thin film disposed to cover first end of the inner tube and an anchor part which encircles a peripheral edge of the thin film and comes into close contact with an inner wall of the outer tube and an outer wall of the inner tube, is arranged in a fluid path, the anchor part is not deformed while being fixed to the tubular structure, and the thin film is deformed to project toward the fluid path side or a side which is opposite to the fluid path.

In the above-described method for controlling the fluid, the fluid may be introduced into the inner tube of the outer tube and the inner tube constituting the above-described valve from an external device so that the thin film of the diaphragm member is deformed. Examples of the fluid includes air, nitrogen, water, and the like.

The above-described deformation of the thin film to project toward the fluid path side or the side which is opposite to the fluid path includes, for example, deformation of the thin film in a direction (an axial direction of a tubular structure constituting the valve) which is perpendicular to an axis of the fluid path.

Such deformation can be performed, for example, by a driving part configured to deform the thin film. Examples of the driving part include a pump configured to inject or discharge a fluid such as air used for power to deform a thin film of a diaphragm member into an inner tube constituting a valve.

In the above-described method for controlling the fluid, the above-described driving part deforms the thin film such that it swells to project toward the fluid path side or the side which is opposite to the fluid path so that an open state (a state in which the fluid can flow) in which the fluid flows through the fluid path may be changed to a closed state (a state in which the fluid cannot flow) in which a flow of the fluid in the fluid path is blocked.

Figure 6B:
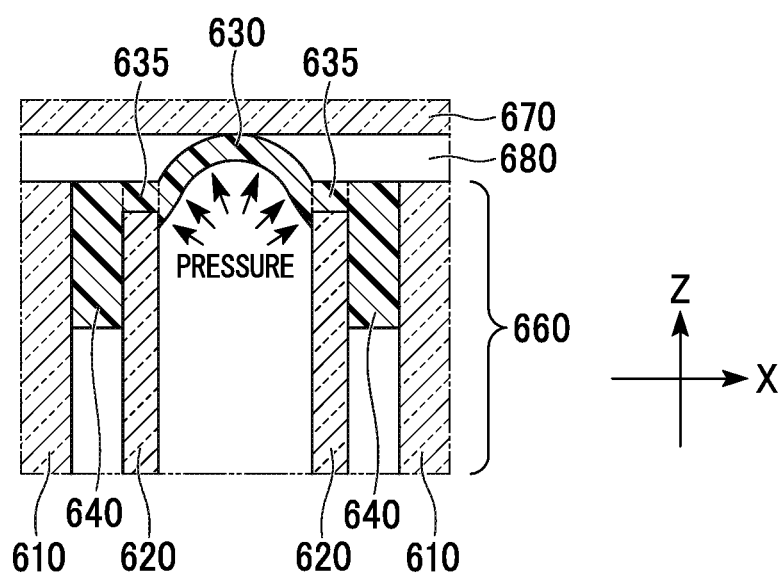
FIG. 6B is a cross-sectional view of the fluid device in the embodiment.

FIGS. 6A and 6B are views showing an embodiment of the method for controlling the fluid. FIG. 6A is a cross-sectional view (the cross-sectional view including the axis of the tubular structure) of the XZ plane of the fluid device 600 related to the embodiment. The fluid device 600 includes the first substrate 660 and the second substrate 670, the first substrate 660 includes the valve which includes the tubular structure having the outer tube 610 and the inner tube 620 and the diaphragm member having the thin film 630, the anchor part 640, and the connection part 635, and the diaphragm member is exposed to the first surface 665 of the first substrate 660. Also, the second substrate 670 has the second surface 675 in which the fluid path 680 is formed. The fluid device 600 is formed by bonding the first substrate 660 to the second substrate 670 such that the first surface 665 is opposite to the second surface 675 and the fluid path 680 crosses a portion which is just above the diaphragm member.

FIG. 6A shows a state in which the fluid can flow (can pass) through an inside of the fluid path 680. FIG. 6B shows a state in which the flow of the fluid in the inside of the fluid path 680 is blocked and thus the fluid cannot flow (cannot pass) by deforming the thin film 630 to project toward the fluid path 680.

The thin film 630 is deformed by performing injecting (pressurizing) or discharging (depressurizing) of a fluid such as air on an inside of the inner tube 620 of the outer tube 610 and the inner tube 620 constituting the valve and controlling an internal pressure thereof.

Also, even if the thin film 630 is deformed such that it swells to project toward the fluid path 680, the diaphragm member is firmly fixed to the tubular structure by the anchor part 640, and thus the diaphragm member is not separated from the tubular structure.

As the method for controlling the fluid, a case (a normally open method) in which the thin film of the diaphragm member constituting the valve swells toward an outside of the hole to block the fluid path has been described above as an example. However, the above-described operating method is not limited to this case. In addition, an operating method (a normally closed method), in which the diaphragm member constituting the valve is recessed (recedes) to the inside of the hole (toward a side which is opposite to the fluid path) so that the fluid path which has been blocked so far is opened, can also be adopted. The operating method of the latter method will be described below.

Figure 7A:
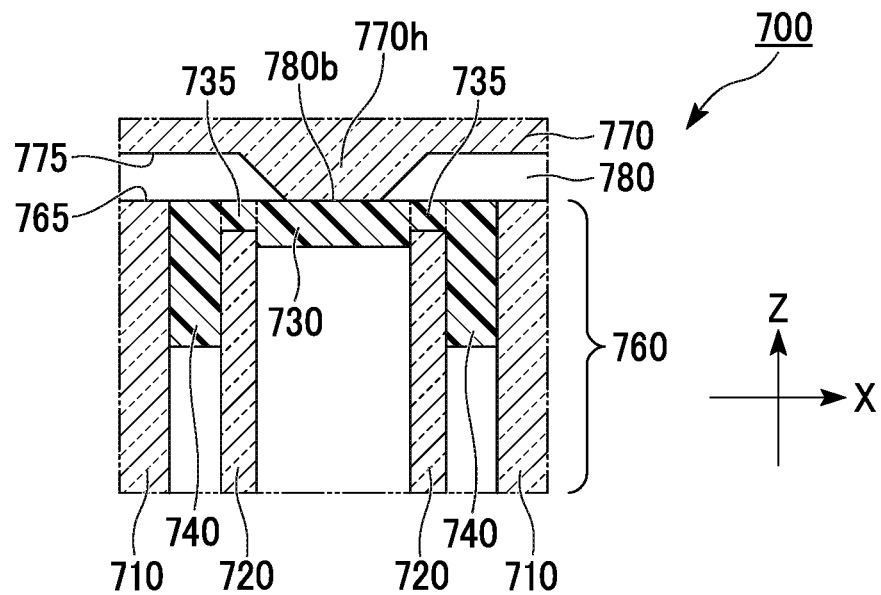
FIG. 7A is a cross-sectional view of a fluid device in an embodiment.

FIG. 7A is a cross-sectional view (a cross-sectional view including an axis of a tubular structure) of an XZ plane of a fluid device 700 related to an embodiment. The fluid device 700 includes a first substrate 760 and a second substrate 770, the first substrate 760 includes a valve which includes a tubular structure having an outer tube 710 and an inner tube 720 and a diaphragm member having a thin film 730, an anchor part 740, and a connection part 735, and the diaphragm member is exposed to a first surface 765 of a first substrate 660. Also, the second substrate 770 has a second surface 775 in which a fluid path 780 is formed. The fluid device 700 is formed by bonding the first substrate 760 to the second substrate 770 such that the first surface 765 is opposite to the second surface 775 and the fluid path 780 crosses a portion which is just above the diaphragm member.

A protrusion 770h is provided at a dividing part 780b in the fluid path 780. Since the protrusion 770h comes into close contact with the opposite thin film 730 of the diaphragm member, the fluid path 780 is blocked at the dividing part 780b. In this state, the flow of a fluid inside the fluid path 780 is blocked, and thus the fluid cannot flow (a closed state).

Figure 7B:
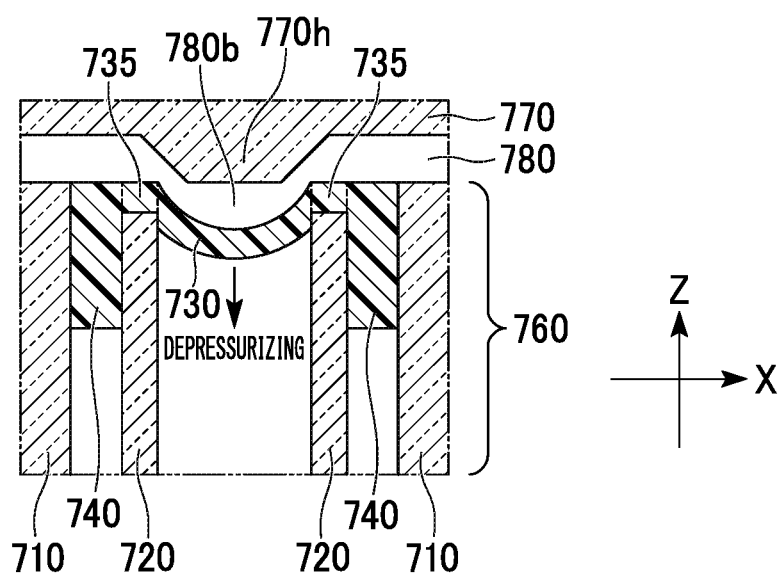
FIG. 7B is a cross-sectional view of the fluid device in the embodiment.

When a fluid such as air inside the inner tube 720 constituting the valve is discharged (depressurized) in this state, as shown in FIG. 7B, the thin film 730 of the diaphragm member is drawn into the inner tube 720 so that the dividing part 780b is opened. In other words, this state indicates a state in which the fluid can flow in the fluid path 780 (an open state).

Also, even if the thin film 730 is deformed to be drawn into the inner tube 720, the diaphragm member is firmly fixed to the tubular structure by the anchor part 740, and the diaphragm member is not separated from the tubular structure.

[Method for Manufacturing Valve]

A method for manufacturing the valve in this embodiment includes a step (Step A) of injecting a polymer composition in which a surface tension thereof is $\gamma$, a contact angle thereof with respect to a tubular structure, which includes an outer tube, an inner tube, and a holding member configured to fix a relative position between the outer tube and the inner tube, is $\theta$, and a density thereof is $\rho$ into the tubular structure, a step (Step B) of flowing the polymer composition, forming a thin film with a height h which is disposed to cover first end of the inner tube and an anchor part with a height H which encircles a peripheral edge of the thin film and comes into close contact with an inner wall of the outer tube and an outer wall of the inner tube, and stopping a flow of the polymer composition at a stage at which an area S1 serving as an area in a cross section C1 which is perpendicular to an axial direction of the tubular structure, which is surrounded by the inner wall of the outer tube and the outer wall of the inner tube, a sum L1 of lengths of the inner wall of the outer tube and the outer wall of the inner tube in the cross section C1, an area S2 serving as an area in the cross section C1, which is surrounded by an inner wall of the inner tube, a length L2 of the inner wall of the inner tube in the cross section C1, h, and H satisfy the following Expression (1), and a step (Step C) of curing the polymer composition the flow of which has stopped:

$$(\gamma \cos\theta \times L1)/S1 - \rho g \times H = (\gamma \cos\theta \times L2)/S2 - \rho g \times h \quad (1)$$

[in the expression, g indicates acceleration of gravity].

Also, since Expression (1) is a model formula, values obtained from this Expression (2) fall a range outside of measured values in experiments in some cases. The expression "satisfy Expression (1)" in this specification means that values (theoretical values) of H−h, which are calculated on the basis of Expression (1), and measured values of H−h satisfy the following Expression (A1). For example, in Expression (A1), α is preferably 20, more preferably 10, and further more preferably 5.

[Math. 11]

$$\left|100 - \frac{\text{Actually measured value}}{\text{Theoretical value}} \times 100\right| \leq \alpha \quad (A1)$$

In other words, in Step B, the height h and the height H may satisfy the following Expression (A3), and in the following equation (A3), α is preferably 20, is more preferably 10, and is further more preferably 5.

[Math. 12]

$$\left|100 - \frac{H-h}{\frac{\gamma\cos\theta}{\rho g}\left(\frac{L1}{S1} - \frac{L2}{S2}\right)} \times 100\right| \leq \alpha \quad (A3)$$

[in the expression, g indicates acceleration of gravity].

The method for manufacturing the valve in this embodiment may include a step of blocking a first end part of a through hole which opens in the first surface of the substrate, a step of injecting a raw material of the diaphragm member from a second end part of the through hole, a step of forming the diaphragm member at least a central portion of which has a thin film shape by solidifying the raw material and which is fitted into the first end part of the through hole, and a step of removing the lid member.

Figure 8:
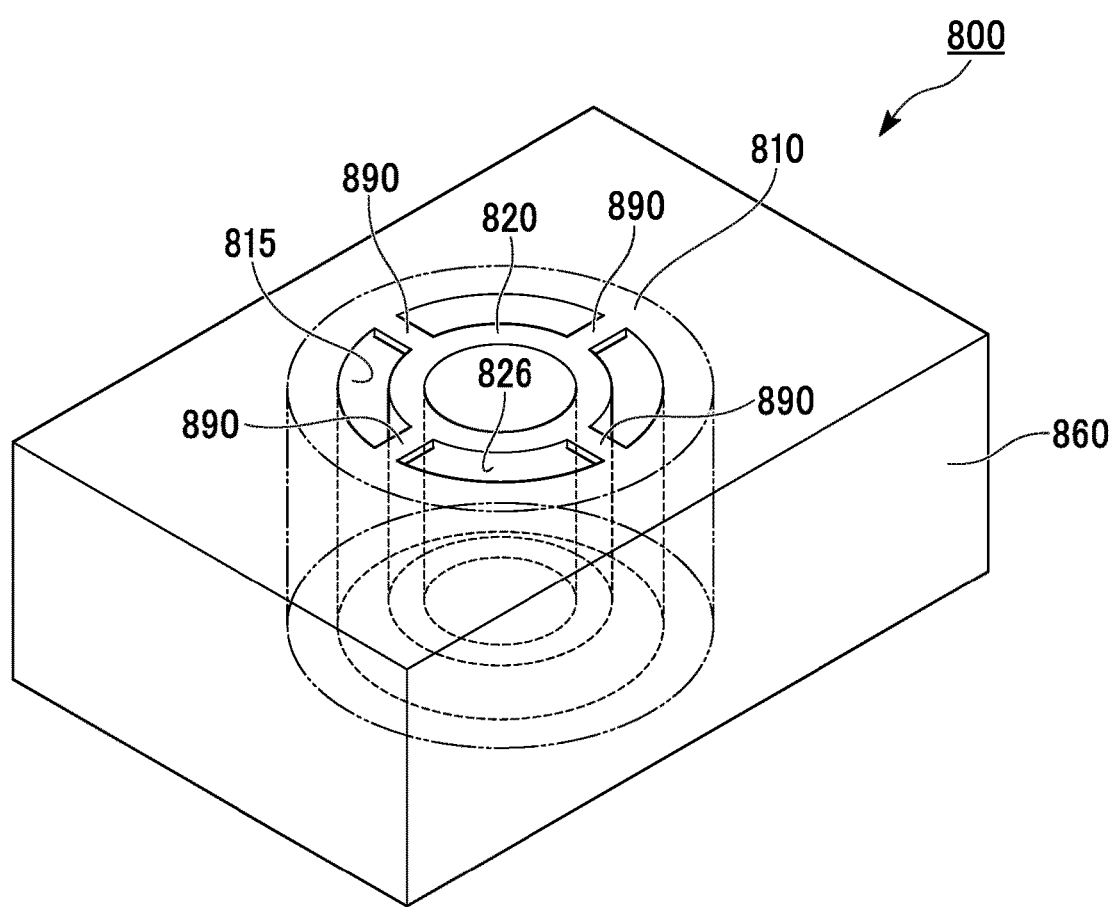
FIG. 8 is a perspective view showing a tubular structure in an embodiment.

FIG. 8 is a perspective view showing an example of a tubular structure 800 for Step A. The tubular structure 800 includes an outer tube 810, an inner tube 820, and a holding member 890 configured to fix a relative position between the outer tube 810 and the inner tube 820.

As shown in FIG. 8, an inner wall 815 of the outer tube 810 may be an inner wall of a hole which opens in a substrate 860. For example, an outer wall of the outer tube 810 may be integrated with the substrate 860.

Also, a shape of the holding member 890 and the number of holding members 890 are not particularly limited, and any shape and number thereof may be adopted as long as the relative position between the outer tube 810 and the inner tube 820 can be fixed. In an example of FIG. 8, the holding member 890 is constituted of four columnar structures connecting the outer tube 810 and the inner tube 820.

In the tubular structure 800, a space between the inner wall 815 of the outer tube 810 and an outer wall 826 of the inner tube 820 is open to atmosphere. Also, a height of the inner tube 820 is lower than a height of the outer tube 810, and the inner tube 820 does not reach a bottom surface of the outer tube 810. The heights of upper surfaces of the inner tube 820 and the outer tube 810 are aligned.

Note that, in the tubular structure 800, both of the inner tube 810 and the outer tube 820 have cylinder shapes. However, as described above, shapes of the outer tube and the inner tube are not particularly limited and may be, for example, cylinders, and may be a polyangular tube such as a triangular tube, a quadrangular tube, and a hexangular tube. Also, the outer tube and the inner tube may be the same or different.

(Step A)

Figure 9:
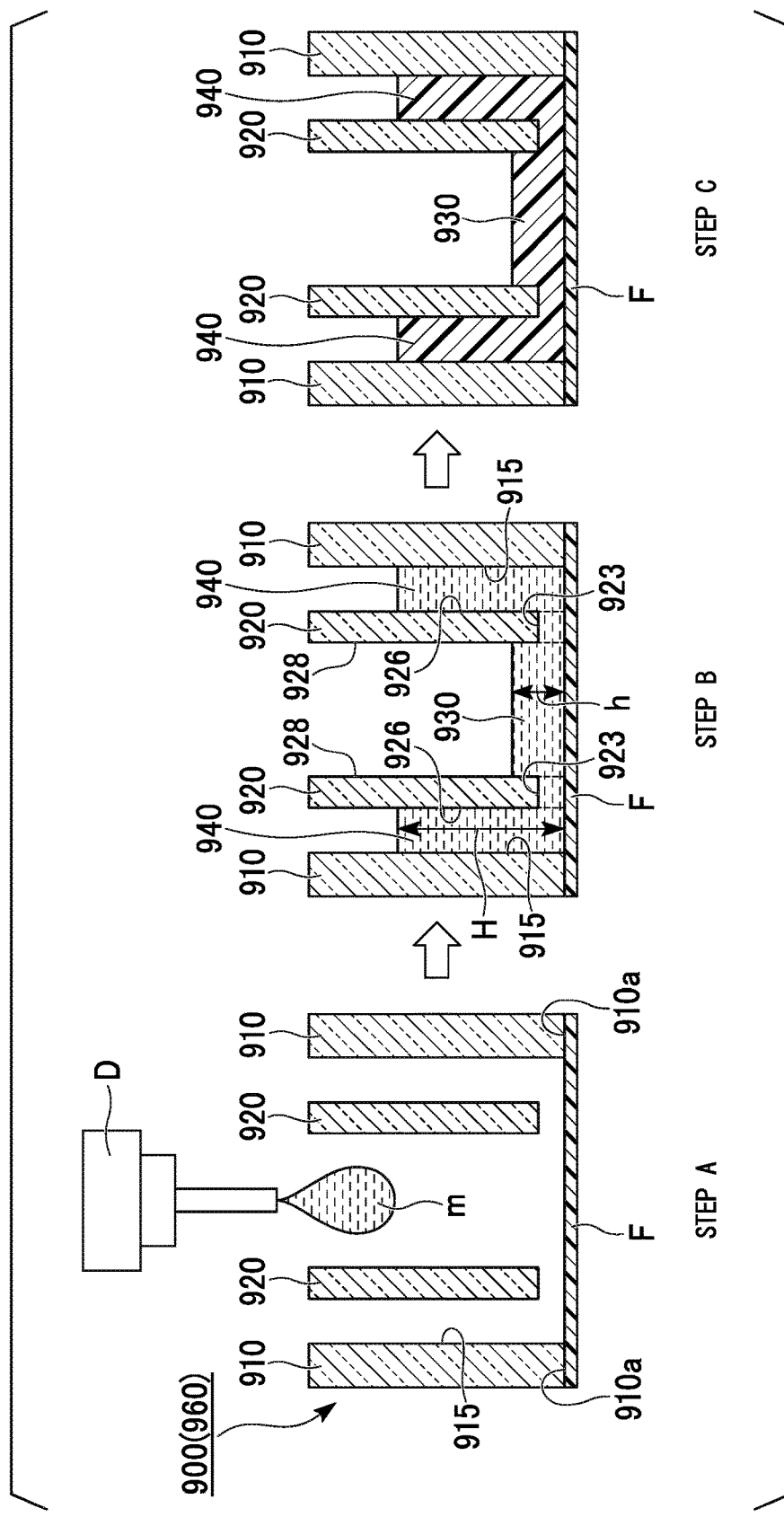
FIG. 9 is a view showing a method for manufacturing a valve in an embodiment.

FIG. 9 is a view showing a method for manufacturing a valve. In Step A, a polymer composition m, in which a surface tension thereof is γ, a contact angle thereof with respect to a tubular structure is θ, and a density thereof is ρ, is injected into a tubular structure 900 including an outer tube 910, an inner tube 920, and a holding member (not shown) configured to fix a relative position between the outer tube 910 and the inner tube 920. The polymer composition m is a material for a diaphragm member. The polymer composition m is injected into the inner tube 920 of the outer tube 910 and the inner tube 920.

A material constituting the tubular structure 900 is not particularly limited, but for example, a material such as a resin (a plastic), glass, a ceramic, a metal, and a semiconductor can be applied. For example, when a valve manufactured in this example is arranged in a micro fluid device, a transparent material such as a resin or glass may be used as a substrate material such that a fluid flowing in a device can be viewed from the outside.

When a constituent material of the tubular structure 900 is, for example, an acrylic resin, and the tubular structure 900 is integrated with a substrate 960, a thickness of the substrate 960 can be set to, for example, about 0.1 to 5.0 cm, and can be set to, for example, about 0.5 to 2.0 cm from the viewpoint of easy processing.

An inner diameter (an inner diameter of an inner wall 915 of the outer tube) of the outer tube 910 of the tubular structure 900 may be appropriately set according to a width or a height (a depth) of a fluid path in which the valve is arranged, and can be set to, for example, about 1.0 to 10 mm.

A method of forming a constitution such as the inner tube 920 and a holding member 990 on the substrate 960 is not particularly limited, but examples of the method include a method of cutting a surface of a substrate using a commercially available three-dimensional (3D) input and output device.

The polymer composition m used may be any as long as the polymer composition m is a material which can be deformed in an axial direction of the tubular structure 900 in accordance with a change in internal pressure of the inner tube 920, and examples of the polymer composition m include an elastomer. An elastomer made of a well-known polymer compound can be applied as the elastomer. Examples of an elastomer material include PDMS.

A bottom surface of the tubular structure 900 is preferably blocked before the polymer composition m is injected. The bottom surface of the tubular structure 900 may be blocked, for example, by bringing a lid member F into close contact with a first surface 910a.

The lid member F is not particularly limited as long as the lid member F is a member which can block the bottom surface of the tubular structure 900 and can be removed in a subsequent step. As an example of the lid member F, a release film made of a resin can be applied. For example, bottom surfaces of a plurality of tubular structures 900 can be temporarily blocked by adhering a release film on an entire surface of the first surface 910a of the substrate 960, on which the plurality of tubular structures 900 are formed.

The thickness of a thin film of the diaphragm member is not particularly limited as long as the thickness thereof is a thickness in which the tubular structure can be deformed in an axial direction thereof at an appropriate pressure, and may be set in accordance with a type or characteristics of a constituent material of the diaphragm member. For example, when the constituent material of the diaphragm member is PDMS, the thickness of the thin film can be set to, for example, about 1 to 1000 μm. When the thickness of the thin film is not uniform due to forming of a meniscus or the like, a thickness of a central portion of the thin film may be used as long as the thickness thereof is in the above-described range. When the thin film has a thickness in the above-described range, the thin film can be sufficiently deformed by a relatively small pressure change.

In the method for manufacturing the valve in this embodiment, the thickness of the thin film of the diaphragm member can be adjusted by adjusting an amount of the polymer composition m injected. Such an injecting method is not particularly limited. However, as shown in FIG. 9, examples of the injecting method include a method of injecting a liquid polymer composition m, which has not been cured, using a nozzle of a dispenser D located above the tubular structure 900.

(Step B)

In Step B, the polymer composition m flows, a thin film 930 with a height h which is disposed to cover a first end 923 of the inner tube and an anchor part 940 with a height H which encircles a peripheral edge of the thin film 930 and comes into close contact with an inner wall 915 of the outer tube 910 and an outer wall 926 of the inner tube 920 are formed, and a flow of the polymer composition m is stopped at a stage at which an area S1 serving as an area in a cross section C1 which is perpendicular to an axial direction of the tubular structure, which is surrounded by the inner wall 915 of the outer tube 910 and the outer wall 926 of the inner tube 920, a sum L1 of lengths of the inner wall 915 of the outer tube 910 and the outer wall 926 of the inner tube 920 in the cross section C1, an area S2 serving as an area in the cross section C1, which is surrounded by an inner wall 928 of the inner tube 920, a length L2 of the inner wall 928 of the inner tube 920 in the cross section C1, h, and H satisfy the following Expression (1):

$$(\gamma \cos \theta \times L1)/S1 - \rho g \times H = (\gamma \cos \theta \times L2)/S2 - \rho g \times h \quad (1)$$

[in the expression, g indicates acceleration of gravity].

Here, Expression (1) will be described. When the polymer composition m is injected into the tubular structure 900, the polymer composition m flows, and a flow of the polymer composition m is stopped at a stage at which a state thereof reaches an equilibrium state in a short time.

The left-hand side of Expression (1) represents a sum of surface tension per unit area applied to the anchor part and gravity per unit area applied to the polymer composition m. Also, the right-hand side of Expression (1) represents the sum of the surface tension per unit area of the thin film and gravity per unit area applied to the polymer composition m. In a state in which the flow of the polymer composition m is stopped, forces applied to the polymer composition m in the anchor part and the thin film balance, and thus the left-hand side is equal to the right-hand side.

Note that L1 of Expression (1) refers to a length of a line of contact at which the polymer composition m comes into contact with a wall surface of the tubular structure 900 at the anchor part. Also, L2 refers to a length of a line of contact at which the polymer composition m comes into contact with a wall surface of the tubular structure 900 at the thin film.

(Step C)

In Step C, the polymer composition m the flow of which has stopped is cured. The curing is performed inside the tubular structure. A method of curing the polymer composition m is not particularly limited, and an usual method such as, for example, heating and ultraviolet irradiation can be applied in accordance with characteristics of the polymer composition m to be used. Also, for example, if the polymer composition m is a two-liquid mixing type of resin composition in which a main agent and a cross-linking agent (a curing agent) are mixed, when a certain period of time elapses after the polymer composition is injected, the polymer composition can be naturally cured.

The lid member F is removed after the polymer composition m is cured so that the substrate 960 in which a target valve is formed can be obtained. For example, when the lid member F is a well-known release film adhered to the first surface 910a of the substrate 960, the lid member F can be simply separated and removed.

A plurality of valves can also be manufactured at the same time using the method for manufacturing the valve associated with this embodiment.

A state in which the flow of the polymer composition m reaches the equilibrium state and stops in the above-described Step B when both of the outer tube and the inner tube of the tubular structure are cylinder shapes will be described below.

Figure 10:
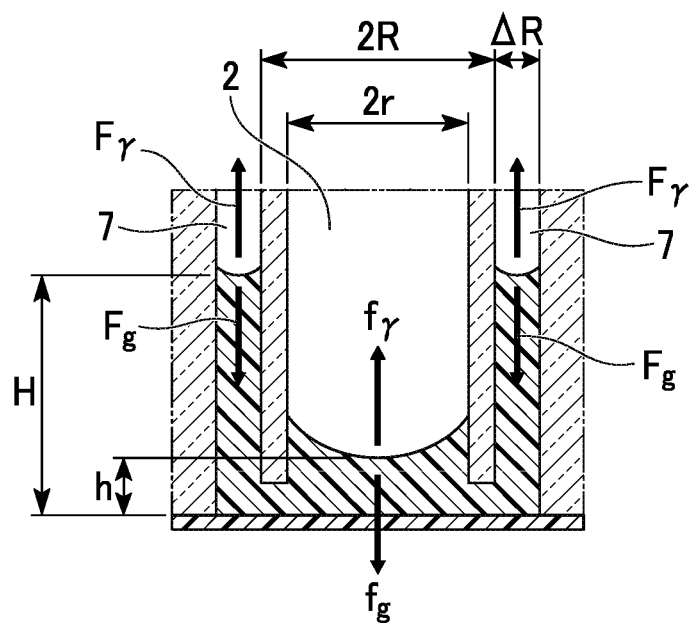
FIG. 10 is a cross-sectional view of a tubular structure in an embodiment.

FIG. 10 is a cross-sectional view showing a cross section including an axis of a tubular structure in which an outer tube and an inner tube are both cylinder shapes. As shown in FIG. 10, in the case of an equilibrium state in the inner tube, a force $f_\gamma$ by which the polymer composition m rises and gravity $f_g$ applied to the polymer composition m balance (that is, $f_\gamma = f_g$). Here, $f_\gamma$ and $f_g$ can be represented by the following Expressions (C1) and (C2).

In Expression (C1), γ indicates the surface tension of the polymer composition m, θ indicates a contact angle of the polymer composition m with respect to the tubular structure, and r indicates a radius of circle formed by the inner wall of the inner tube.

In Expression (C2), ρ indicates a density of the polymer composition m, g indicates the acceleration of gravity, r is the same as in Expression (C1), and h indicates the height of the polymer composition m in the thin film of the diaphragm member.

[Math. 13]

$$\begin{cases} f_\gamma = \gamma \cos\theta \times 2\pi r & (C1) \\ f_g = \rho g \times \pi r^2 \times h & (C2) \end{cases}$$

Also, in the case of an equilibrium state of an area surrounded by the inner wall of the outer tube and the outer wall of the inner tube, a force $F_\gamma$ by which the polymer composition m rises and gravity $F_g$ applied to the polymer composition m balance (that is, $F_\gamma = F_g$). Here, $F_\gamma$ and $F_g$ can be represented by the following Expressions (C3) and (C4).

In Expression (C3), θ is the same as in Expression (C1), and R indicates the radius of a circle formed by the outer wall of the inner tube.

ΔR indicates a length (a length obtained by subtracting R from a radius of a circle formed by the inner wall of the outer tube) from the inner wall of the outer tube to the outer wall of the inner tube.

In Expression (C4), ρ and g are the same as in Expression (C2), R and ΔR are the same as in Expression (C3), and H indicates a height of the polymer composition m in the anchor part of the diaphragm member.

[Math. 14]

$$\begin{cases} F_\gamma = \gamma \cos\theta \times 2\pi\{(R + \Delta R) + R\} & (C3) \\ F_g = \rho g \times \pi\{(R + \Delta R)^2 - R^2\} \times H & (C4) \end{cases}$$

The following Expression (C5) is established in an equilibrium state. Thus, when the above-described Expressions (C1) to (C4) are substituted into Expression (C5) and calculation is performed, the following Expression (C6) is obtained. In addition, when the following Expression (C6) is changed, the following Expression (C7) is obtained.

[Math. 15]

$$\frac{F_\gamma - F_g}{\pi\{(R + \Delta R)^2 - R^2\}} = \frac{f_\gamma - f_g}{\pi r^2} \quad (C5)$$

$$\frac{\gamma \cos\theta \times 2\pi\{(R + \Delta R) + R\}}{\pi\{(R + \Delta R)^2 - R^2\}} - \rho g \times H = \frac{\gamma \cos\theta \times 2\pi r}{\pi r^2} - \rho g \times h \quad (C6)$$

$$H - h = \frac{2\gamma \cos\theta}{\rho g}\left(\frac{1}{\Delta R} - \frac{1}{r}\right) \quad (C7)$$

In the valve of this embodiment, H−h>0 may be satisfied. It can be understood based on the above-described Expression (C7) that conditions, from which H−h>0 is obtained, include cos θ>0, that is, the fact that the contact angle θ of the polymer composition m with respect to the tubular structure is in a range of 0<θ<90° and the fact that the following Expression (C8) is satisfied.

[Math. 16]

$$\frac{1}{\Delta R} > \frac{1}{r} \quad (C8)$$

When the above-described Expression (C8) is changed, the following Expression (a) is obtained. Therefore, a valve related to an embodiment of the present invention satisfies the following Expression (a).

$$\Delta R < r \quad (a)$$

Also, H–h and a film thickness of a thin film of a manufactured valve can be attained as designed by selecting the polymer composition m with properties such as γ, θ, and ρ according to a purpose thereof, designing a shape and a size of the tubular structure, adjusting an amount of the polymer composition m injected into the tubular structure, and the like on the basis of the above-described Expressions (1), (C7), and the like.

EXAMPLES

The present invention will be described below using Experimental Examples, but the present invention is not limited to the following Experimental Examples.

Experimental Example 1

A valve shown in FIG. 5 was prepared, and a height (H and h in FIG. 5) of polydimethylsiloxane (PDMS) serving as a material of the valve was actually measured. Note that both of the outer tube and the inner tube in the valve of the third embodiment have cylinder shapes.

Tubular structures were formed by processing a substrate (manufactured by Acryace Co. in Japan) made of poly (methylmethacrylate-co-styrene) having a size of 100×80×5 mm using a milling machine (product name "MDX-540" manufactured by Roland DG Co.). A height of an inner tube was 0.5 mm shorter than a height (5 mm) of an outer tube. Tubular structures of two types such as a tubular structure in which r in FIG. 5 is 1 mm, R+ΔR is 2.5 mm, R−r is 0.8 mm, and ΔR is 0.7 mm and a tubular structure in which r in FIG. 5 is 1.4 mm, R+ΔR is 2.5 mm, R−r is 0.4 mm, and ΔR is 0.7 mm were prepared.

Subsequently, a film (product name "SPV-P-6030" manufactured by Nitto Denko Co.) was adhered to the substrate in which the tubular structures were formed as a lid member. Subsequently, 35 to 50 μL of a polymer composition was injected into the tubular structures using a precision dispenser (product name "Nano Master SMP-III" manufactured by Musashi Engineering Inc.) and a robot (product name "SHOTMASTER 200DS" manufactured by Musashi Engineering Inc.). As the polymer composition, a mixture of (Sylgard 184 manufactured by Dow Corning Co.) with PDMS (a main agent) and a curing agent (a cross-linking agent) at 15:1 (v/v) was used.

Subsequently, the tubular structures into which the polymer composition was injected were cured by heating them in an oven at 80° C. after they had been left for 10 minutes serving as a sufficient time for the flow of the polymer composition to reach an equilibrium state. After that, the film used as the lid member was separated and the valve was completed.

Figure 14:
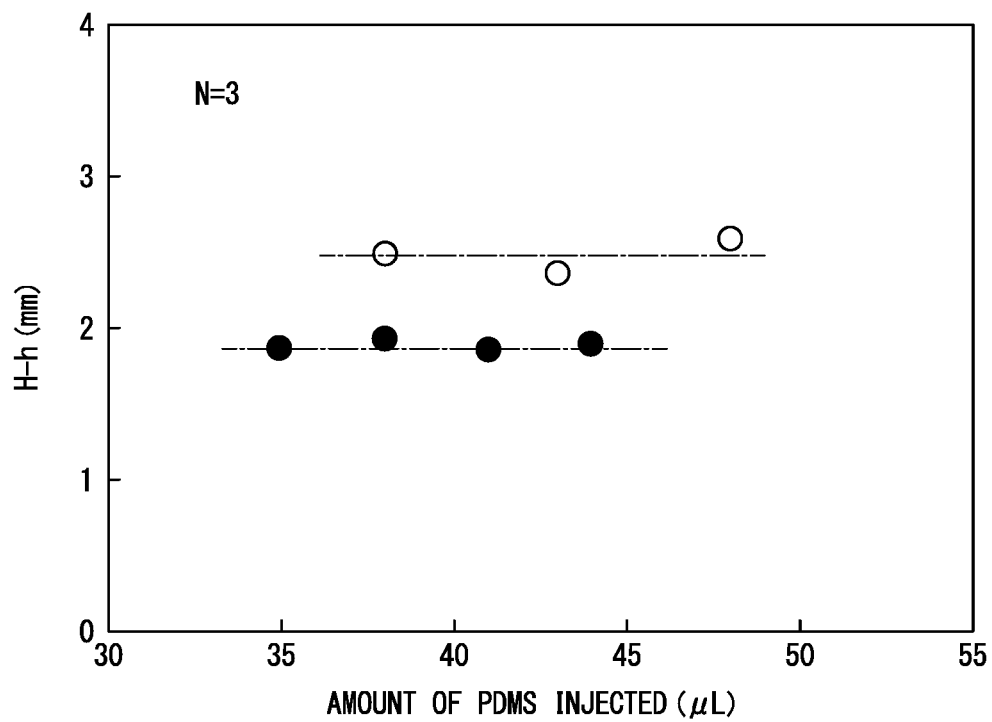
FIG. 14 is a graph showing results of Experimental Example 1.

FIG. 14 is a graph showing measured values (N=3) of lengths of H–h of valves manufactured by injecting 35 to 50 μL of a polymer composition into valves with r=1 mm and r=1.4 mm. The length of H–h in the valve with r=1 mm was substantially constant in a range of 1.87±0.0261 mm regardless of an amount of the polymer composition injected. Also, the length of H–h in the valve with r=1.4 mm was substantially constant in a range of 2.49±0.0962 mm regardless of an amount of the polymer composition injected.

Note that, since the surface tension γ of PDMS was 21.6 dyn/cm, a contact angle θ of PDMS with respect to the tubular structure was 20°, and a density ρ of PDMS was 1.11 g/cm³, a theoretical value of the length of H–h in the valve with r=1 mm was 1.60 mm, and a theoretical value of the length of H–h in the valve with r=1.4 mm was 2.66 mm in accordance with Expression (C7). Measured values of H–h, which are described above were values which were close to the theoretical values.

Experimental Example 2

(Evaluation of Mechanical Strength)

Figure 15:
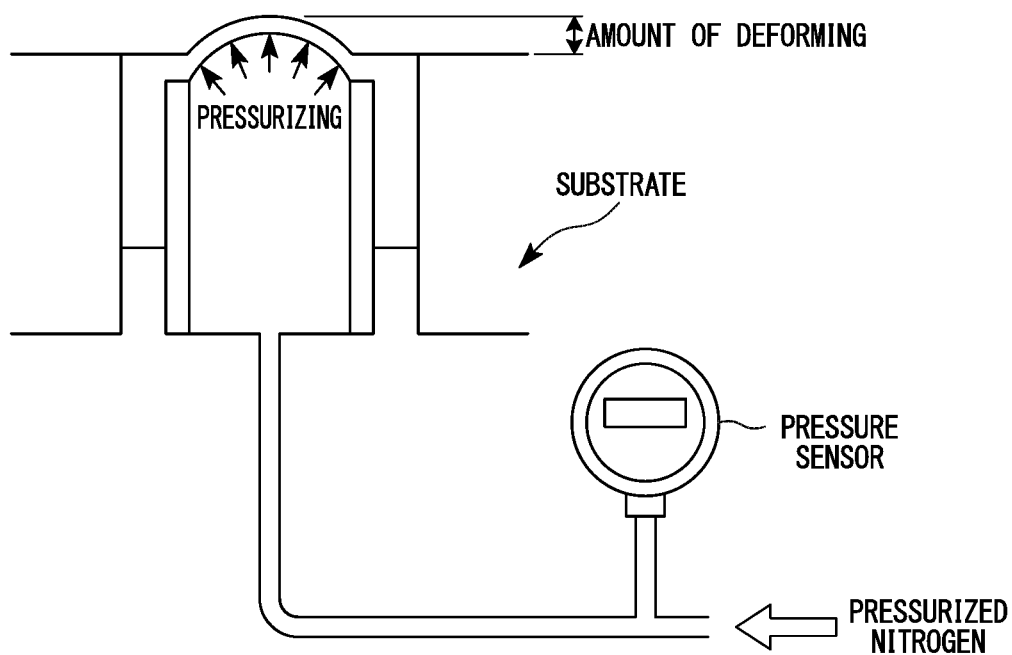
FIG. 15 is a schematic diagram of a measuring device used in Experimental Example 2.

The same valve (r=1 mm) as that of Experimental Example 1 was prepared, and a mechanical strength of the valve was examined. As a material of a diaphragm member, PDMS was used. A device shown in FIG. 15 was assembled, an inner tube of the valve was pressurized by injecting nitrogen gas into the inner tube of the valve, and applied pressures and amounts of deforming of a thin film of the valve were measured.

Figure 16:
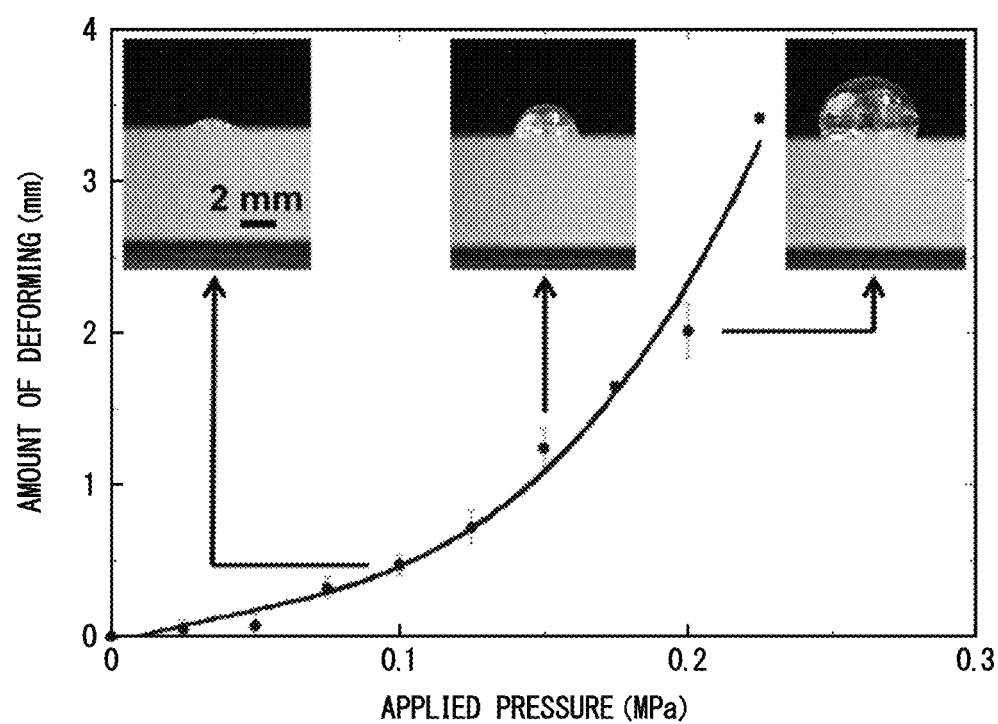
FIG. 16 shows a graph and photos which show results of Experimental Example 2.

FIG. 16 shows a graph and photos of the valve which show a relationship between applied pressures and amounts of deforming of the thin film of the valve. It was clear from these results that an applied pressure of 0.1 MPa or more was needed to block a fluid path with a height 500 μm in the valve of this experimental example.

Experimental Example 3

(Opening and Closing Test)

Figure 17A:
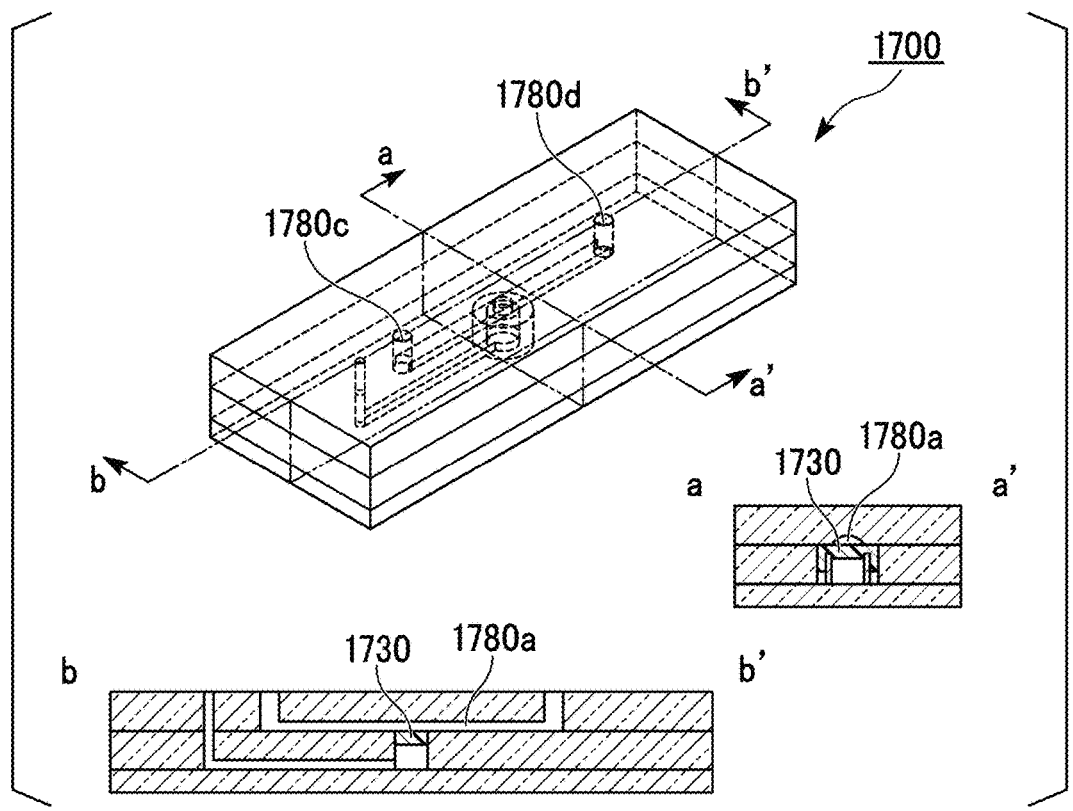
FIG. 17A is a schematic diagram of a fluid device in an embodiment.

As shown in FIG. 17A, a fluid device 1700, in which a fluid path 1780a, a cross section of which had a rectangular shape of 0.5×2 mm and in which diameters of an inlet port 1780c and an outlet port 1780d of which were 3 mm, the same valve (r=1 mm) as that of Experimental Example 1 being arranged in the fluid path and a fluid path 1780b through which nitrogen was supplied into an inner tube of the valve were provided in a substrate with a size of 100×80×5 mm, was prepared.

The fluid path 1780a was filled with a 0.05 w/w % aqueous solution of sulforhodamine B (Kanto Chemical Co., Inc.) serving as a fluorescent substance, and an operation of the valve was observed. Fluorescence from an area in the fluid path 1780a, which comes into contact with a thin film 1730 of the valve, was measured. The fluorescence of sulforhodamine B was introduced into an avalanche photodiode (APD; product name "C5460," Hamamatsu Photonics K.K.) via a diaphragm (product name "ID15/M," Thorlabs Japan Inc.) and a lens (product name "LA1805," Thorlabs Japan Inc.). An analog signal from the APD was converted into a digital signal using an input module (product name "NIUSB-6008," National Instruments Co.).

Figure 17B:
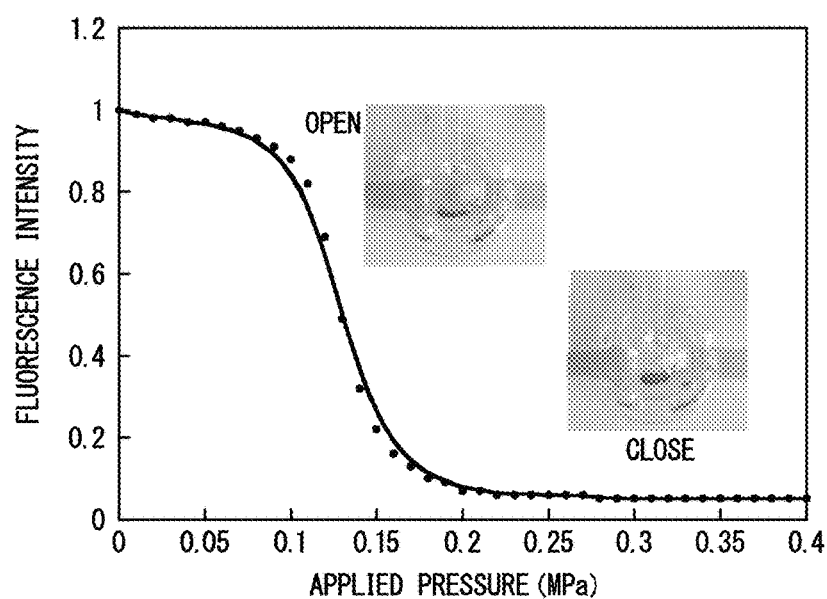
FIG. 17B is a graph and photos which show results of Experimental Example 3.

FIG. 17B shows a graph showing a relationship between pressures applied by nitrogen gas supplied into the inner tube of the valve via the fluid path 1780b and measured fluorescence intensities and photos near the valve of the fluid device. As shown in FIG. 17B, the fluorescence intensities reduced as the applied pressures increased. A decrease in the fluorescence intensities due to deformation of the thin film was observed from the applied pressure of 0.1 MPa, and the valve was fully closed at the applied pressure of about 0.2 MPa. In this experimental example, damage of the thin film of the valve was not seen even under conditions of an applied pressure of 0.4 MPa.

Experimental Example 4

(Response Rate Evaluation)

Figure 18:
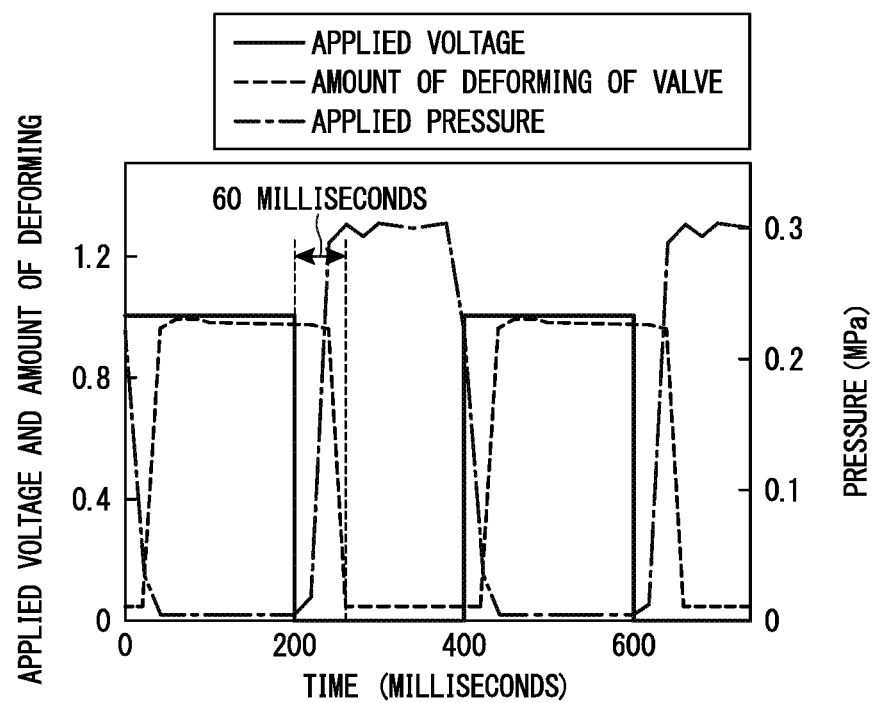
FIG. 18 is a graph and photos which show results of Experimental Example 4.

A valve control voltage, opening/closing (an amount of deforming of the thin film) of the valve, and a temporal relationship between an applied pressure and the valve were measured using the fluid device of Experimental Example 3. FIG. 18 is a graph showing results of this experimental example. A result was that it is clear that the valve can be opened or closed 60 milliseconds after a valve control voltage is applied.

Experimental Example 5

(Preparation of Peristaltic Pump)

Figure 19A:
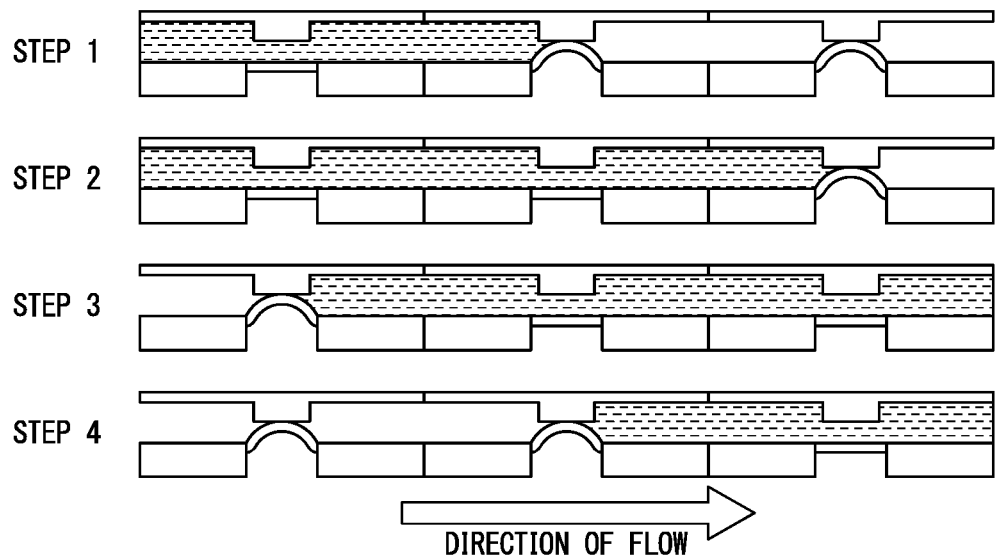
FIG. 19A is a schematic diagram of a fluid device in an embodiment.

A fluid device (a peristaltic pump), in which the three valves (r=1 mm) which are the same as those of Experimental Example 1 were disposed in the fluid path, was prepared as shown in FIG. 19A. The valves were opened or closed each ½ cycle, operations of adjacent valves were shifted from each other by ¼ of a cycle, and thus a liquid in the fluid path was fed. A liquid feed flow rate was measured when changing a driving frequency.

Figure 19B:
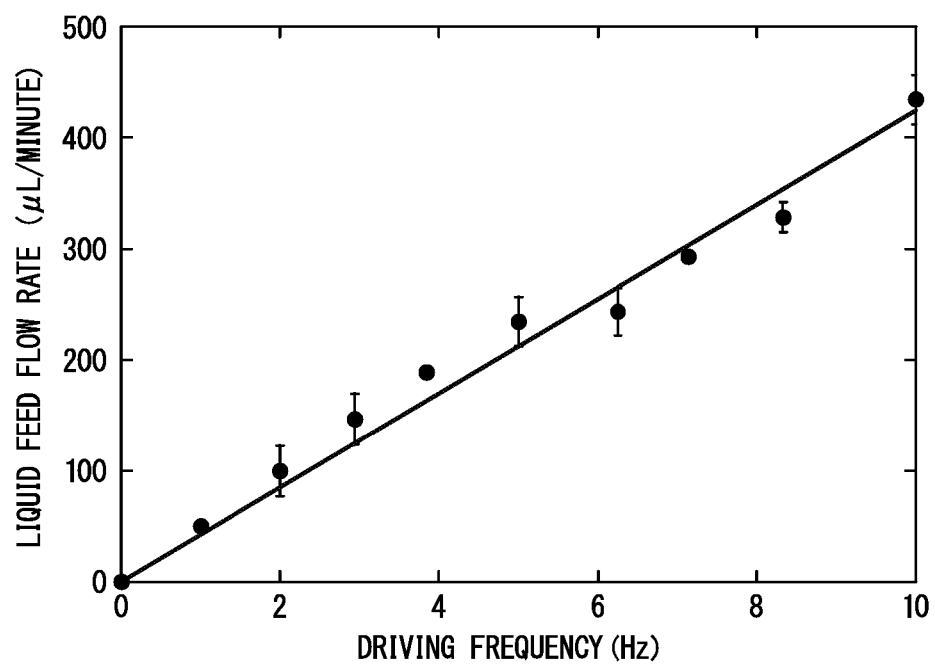
FIG. 19B is a graph showing results of Experimental Example 5.

FIG. 19B is a graph showing a relationship between driving frequencies of the peristaltic pump and liquid feed flow rates of a liquid. As shown in the graph, it can be seen that, when the driving frequency and the liquid feed flow rate of the liquid have a relationship of a monotonic increase, and the peristaltic pump operates normally.

INDUSTRIAL APPLICABILITY

According to the present invention, a valve having excellent durability, a fluid device including the valve, a method for controlling a fluid using the valve, and a method for manufacturing the valve having excellent durability can be provided.

REFERENCE SIGNS LIST 110, 660, 760 first substrate
665, 765 first surface of first substrate
111 resin sheet
112, 670, 770 second substrate
675, 775 second surface of second substrate
113 through hole
21, 52i, 52j, 114, 680, 780 fluid path
20 stacked substrate
21a small diameter part
51 fluid device
52 exosome purifying part
52a cleaning solution introducing inlet
52b sample introducing inlet
52c lysis solution introducing inlet
52d exosome fixing part
53 biomolecule purifying part
53a biomolecule cleaning solution introducing inlet
53b biomolecule recovering solution introducing inlet
53c biomolecule fixing part
54 biomolecule detecting part
54a detecting probe introducing inlet
54b cleaning solution introducing inlet
54c, 860, 960 substrate
55 first fluid path
56 second fluid path
57, 58, 59 waste liquid tank
52e, 52f, 52g, 53d, 53f, 54d, 55a, 60a, 61a, 62a, 400, 500, 600, 700 valve
410, 510, 610, 710, 810, 910 outer tube
413 first end of outer tube
415, 515, 815, 915 inner wall of outer tube
420, 520, 620, 720, 820, 920 inner tube
423, 923 first end of inner tube
426, 526, 926 outer wall of inner tube
428, 528 inner wall of inner tube
430, 530, 630, 730, 930 thin film
435, 535, 635, 735 connecting part
440, 540, 640, 740, 940 anchor part
450 central axis
780b dividing part
770h protrusion
800, 900 tubular structure
890, 990 holding member
910a first surface of substrate
D dispenser
F lid member
$f_\gamma$, $F_\gamma$ force
$f_g$, $F_g$ gravity
H, h height
m polymer composition
R, r radius

The invention claimed is:

1. A valve comprising:
a tubular structure having an outer tube and an inner tube; and
a diaphragm member having a film that covers one end of the inner tube and an anchor part which encircles a peripheral edge of the film and comes into contact with an inner wall of the outer tube and an outer wall of the inner tube, wherein the film has a height h,
the anchor part has a height H,
the diaphragm member is formed by curing a polymer composition,
a surface tension of the polymer composition is $\gamma$, a contact angle thereof with respect to the tubular structure is $\theta$, and a density thereof is $\rho$,
in which an area S1 of a region, in a cross section C1 which is perpendicular to an axial direction of the tubular structure, surrounded by the inner wall of the outer tube and the outer wall of the inner tube, a sum L1 of lengths of the inner wall of the outer tube and the outer wall of the inner tube in the cross section C1, an area S2 of a region, in the cross section C1, surrounded by an inner wall of the inner tube, a length L2 of the inner wall of the inner tube in the cross section C1, h, and H satisfy the following Expression (1):

$$(\gamma \cos \theta \times L1)/S1 - \rho g \times H = (\gamma \cos \theta \times L2)/S2 - \rho g \times h \qquad (1)$$

[in the expression, a indicates acceleration of gravity].

2. The valve according to claim 1, wherein the film and the anchor-part are formed integrally and continuously.

3. The valve according to claim 1, wherein the diaphragm member includes a connection part provided between the film and the anchor part, and
the connection part comes into contact with and is fixed to a surface of the one end of the inner tube.

4. The valve according to claim 1, wherein an end of the inner tube, which is different from the end at which the film is disposed, is open.

5. The valve according to claim 1, wherein the inner tube has a cylinder shape of an inner diameter 2r and an outer diameter 2R, and the outer tube has a cylinder shape of an inner diameter 2(R+ΔR), and h and H satisfy the following Expression (2):

$$(\gamma \cos \theta \times 2\pi\{(R+\Delta R)+R\})/\pi\{(R+\Delta R)^2-R^2\}-\mu g \times H = (\gamma \cos \theta \times 2\pi r)/\pi r^2 - \mu g \times h \quad (2)$$

[in the expression, g indicates acceleration of gravity].

6. The valve according to claim 5, wherein r and ΔR satisfy the following Expression (a):

$$\Delta R < r \quad (a).$$

7. A fluid device comprising:

the valve according to claim 1; and a fluid path in which the valve is provided.

8. The fluid device according to claim 7, comprising:

a first substrate which includes the valve and in which the diaphragm member is exposed in a first surface; and a second substrate having a second surface in which the fluid path is formed, wherein the first surface faces the second surface, and the first substrate is bonded to the second substrate such that the fluid path passes above the diaphragm member.

9. The fluid device according to claim 8, wherein the second substrate has a protrusion provided at a position which is opposite to the diaphragm member and configured to narrow the fluid path, and the protrusion has a contact surface which is able to come into contact with the diaphragm member.

10. The fluid device according to claim 7, comprising a plurality of valves serially provided in the fluid path, which serves as a pump.

11. The valve according to claim 1, wherein the anchor part is fixed to the tubular structure, and the film is deformed to project toward a fluid path side or a side which is opposite to the fluid path so that a flow of a fluid in the fluid path is controlled.

12. A valve comprising:

a tubular structure having an outer tube and an inner tube; and a diaphragm member having a film that covers one end of the inner tube and an anchor part which encircles a peripheral edge of the film and comes into contact with an inner wall of the outer tube and an outer wall of the inner tube, wherein in a rest or neutral state, the film has a generally flat-shaped first surface facing a path of a fluid and a meniscus-shaped second surface, opposing the first surface, which provides the film of the diaphragm member with a non-uniform thickness.

13. The valve according to claim 12, wherein the film and the anchor part are formed integrally and continuously.

14. The valve according to claim 12, wherein the diaphragm member includes a connection part provided between the film and the anchor part, and the connection part comes into contact with and is fixed to a surface of the one end of the inner tube.

15. The valve according to claim 12, wherein an end of the inner tube, which is different from the end at which the film is disposed, is open.

16. The valve according to claim 12, wherein the anchor part is fixed to the tubular structure, and the film is deformed to project toward the fluid path side or a side which is opposite to the fluid path so that a flow of a fluid in the fluid path is controlled.

17. A fluid device comprising:

the valve according to claim 12; and a fluid path in which the valve is provided.

18. The fluid device according to claim 17, comprising:

a first substrate which includes the valve and in which the diaphragm member is exposed in a first surface; and a second substrate having a second surface in which the fluid path is formed, wherein the first surface faces the second surface, and the first substrate is bonded to the second substrate such that the fluid path passes above the diaphragm member.

19. The fluid device according to claim 18, wherein the second substrate has a protrusion provided at a position which is opposite to the diaphragm member and configured to narrow the fluid path, and the protrusion has a contact surface which is able to come into contact with the diaphragm member.

20. The fluid device according to claim 17, comprising a plurality of valves serially provided in the fluid path, which serves as a pump.

* * * * *